US012638503B2

(12) United States Patent
Iqbal

(10) Patent No.: US 12,638,503 B2
(45) Date of Patent: May 26, 2026

(54) HIGH-THROUGHPUT SCAN ARCHITECTURE

(71) Applicant: Google LLC, Mountain View, CA (US)

(72) Inventor: Syed Shakir Iqbal, Bengaluru (IN)

(73) Assignee: Google LLC, Mountain View, CA (US)

( * ) Notice: Subject to any disclaimer, the term of this patent is extended or adjusted under 35 U.S.C. 154(b) by 5 days.

(21) Appl. No.: 18/726,670

(22) PCT Filed: Jan. 5, 2022

(86) PCT No.: PCT/US2022/011310
§ 371 (c)(1),
(2) Date: Jul. 3, 2024

(87) PCT Pub. No.: WO2023/132825
PCT Pub. Date: Jul. 13, 2023

(65) Prior Publication Data
US 2025/0076380 A1     Mar. 6, 2025

(51) Int. Cl.
G01R 31/3185     (2006.01)

(52) U.S. Cl.
CPC ............... G01R 31/318555 (2013.01); G01R 31/318547 (2013.01); G01R 31/318552 (2013.01);
(Continued)

(58) Field of Classification Search
CPC .... G01R 31/318555; G01R 31/318547; G01R 31/318552; G01R 31/318563; G01R 31/318575
See application file for complete search history.

(56) References Cited

U.S. PATENT DOCUMENTS 5,008,905 A     4/1991 Lee et al.
6,519,729 B1 *  2/2003 Whetsel ........... G01R 31/31721
                                                      714/729
(Continued)

FOREIGN PATENT DOCUMENTS

JP      2004093462 A     3/2004
JP      2017507323 A     3/2017
JP      2021124371 A     8/2021

OTHER PUBLICATIONS

W. Pradeep, P. Narayanan, R. Mittal, N. Maheshwari and N. Naresh, "Frequency scaled segmented (FSS) scan architecture for optimized scan-shift power and faster test application time," 2017 IEEE International Test Conference (ITC), Fort Worth, TX, USA, 2017, pp. 1-10, (Year: 2017).*
(Continued)

*Primary Examiner* — Cynthia Britt
(74) *Attorney, Agent, or Firm* — Fish & Richardson P.C.

(57)     ABSTRACT

Methods, systems, and apparatus, for a high throughput scan architecture. The scan architecture can include a clock controller, a decompressor, a scan chain, and a compressor. In some implementations, a set of values that represents a particular data pattern is received. A first data signal is generated using at least a portion of the values in the set of values, where the first data signal has a first frequency. A first series of latches and a second series of latches are used to extract alternating values of the at least portion of values from the first data signal, where the first series and second series of latches extract the alternating values at a second frequency that is a fraction of the first frequency. Outputs of the first and second series of latches are combined to generate a second data signal, where the second data signal has the first frequency.

20 Claims, 8 Drawing Sheets

(52) U.S. Cl.
CPC ................ *G01R 31/318563* (2013.01); *G01R 31/318575* (2013.01)

(56) References Cited

U.S. PATENT DOCUMENTS

| | | | |
|---|---|---|---|
| 6,559,697 | B2 | 5/2003 | Kikuchi |
| 6,938,225 | B2 | 8/2005 | Kundu |
| 7,657,809 | B1 | 2/2010 | Bhatia |
| 8,793,546 | B2 | 7/2014 | Tekumalla et al. |
| 9,229,055 | B2 | 1/2016 | Narayanan et al. |
| 9,395,414 | B2 | 7/2016 | Sonawane et al. |
| 9,599,672 | B2 | 3/2017 | Abhishek et al. |
| 2004/0123198 | A1 | 6/2004 | Gschwind |
| 2006/0236176 | A1 | 10/2006 | Alyamani et al. |
| 2008/0195346 | A1 | 8/2008 | Lin et al. |
| 2013/0159800 | A1 | 6/2013 | Ravi et al. |
| 2015/0185283 | A1 | 7/2015 | Mittal et al. |
| 2018/0003771 | A1* | 1/2018 | Nishikawa ..... G01R 31/318547 |
| 2020/0309851 | A1 | 10/2020 | Narayanan et al. |
| 2020/0355744 | A1 | 11/2020 | Narayanan et al. |

OTHER PUBLICATIONS

P. N. Solanki, N. Ranpura and Y. D. Parmar, "DFT Methodologies for Reducing Shift Power of Compression Architecture for 28NM ASIC," 2018 2nd International Conference on Trends in Electronics and Informatics (ICOEI), Tirunelveli, India, 2018, pp. 1-4, (Year: 2018).*

[No Author Listed], "ADC12D1620QML-SP 12-Bit, Single Or Dual, 3200- or 1600-MSPS RF Sampling Analog-to-Digital Converter (ADC)," Texas Instruments, Apr. 2017, 83 pages.

International Preliminary Report on Patentability in International Appln. No. PCT/US2022/011310, mailed on Jul. 18, 2024, 7 pages.

International Search Report and Written Opinion in International Appln. No. PCT/US2022/011310 mailed on Aug. 30, 2022, 15 pages.

Pandey et al., "Design And Implementation of High Speed Scan-Hold Flip Flop based Shift Registers," International Journal of Advance Engineering and Research Development, Dec. 2017, 4(12):640-647.

Samaranayake et al., "Dynamic scan: Driving Down the Cost of Test," Computer, Oct. 2002, 35(10):63-68.

Sitchinava, "Dynamic Scan Chains—A Novel Architecture to Lower the Cost of VLSI Test," Thesis for the degree of Master of Engineering in Electrical Engineering and Computer Science, Massachusetts Institute of Technology, Department of Electrical Engineering and Computer Science, Aug. 2003, 64 pages.

Solomon et al., "A Novel Dynamic Scan Low Power Design for Testability Architecture for System-On-Chip Platform," Research India Publications, 2018, 13(7):5256-5259.

Tahoori, "Lecture 3: Design for Testability (II)," Testing Digital Systems II, Karlsruhe Institute of Technology, 2010, 17 pages.

Wikipedia.com [online], "Shift register," May 17, 2024, retrieved Sep. 30, 2024, retrieved from URL<https://en.wikipedia.org/wiki/Shift_register>, 5 pages.

Xiang et al., "Low-Power Scan Testing for Test Data Compression Using a Routing-Driven Scan Architecture," Institute of Electrical and Electronics Engineers, Jul. 2009, 28(7):1101-1105.

Office Action in Korean Appln. No. 10-2024-7026048, mailed on Jul. 11, 2025, 10 pages (with English translation).

Office Action in Japanese Appln. No. 2024-540722, mailed on Dec. 16, 2025, 7 pages (with English Translation).

Office Action in Taiwanese Appln. No. 111129538, mailed on Jan. 14, 2026, 19 pages (with English translation).

* cited by examiner

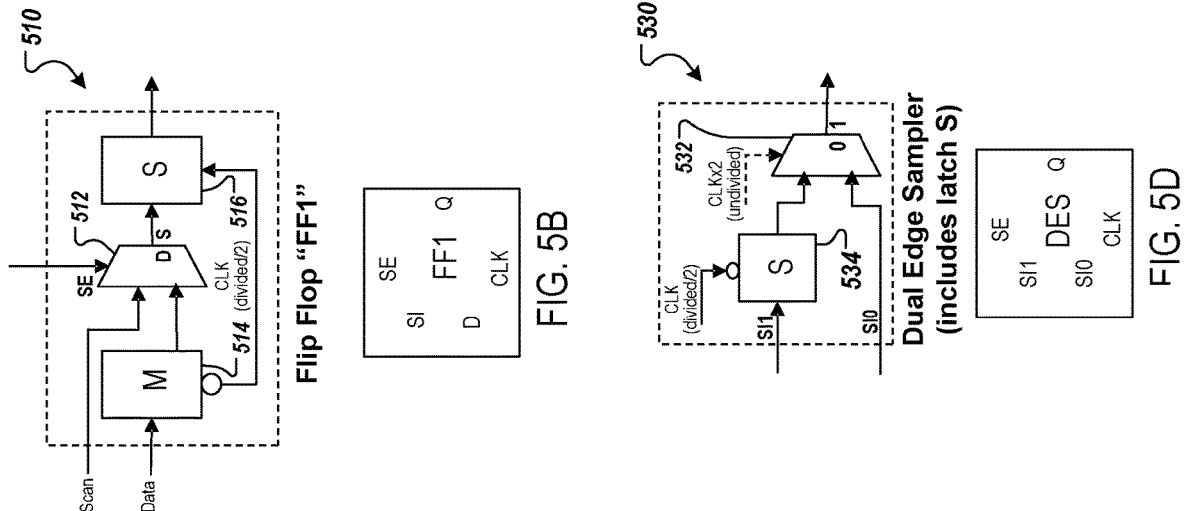
FIG. 5B
FIG. 5D
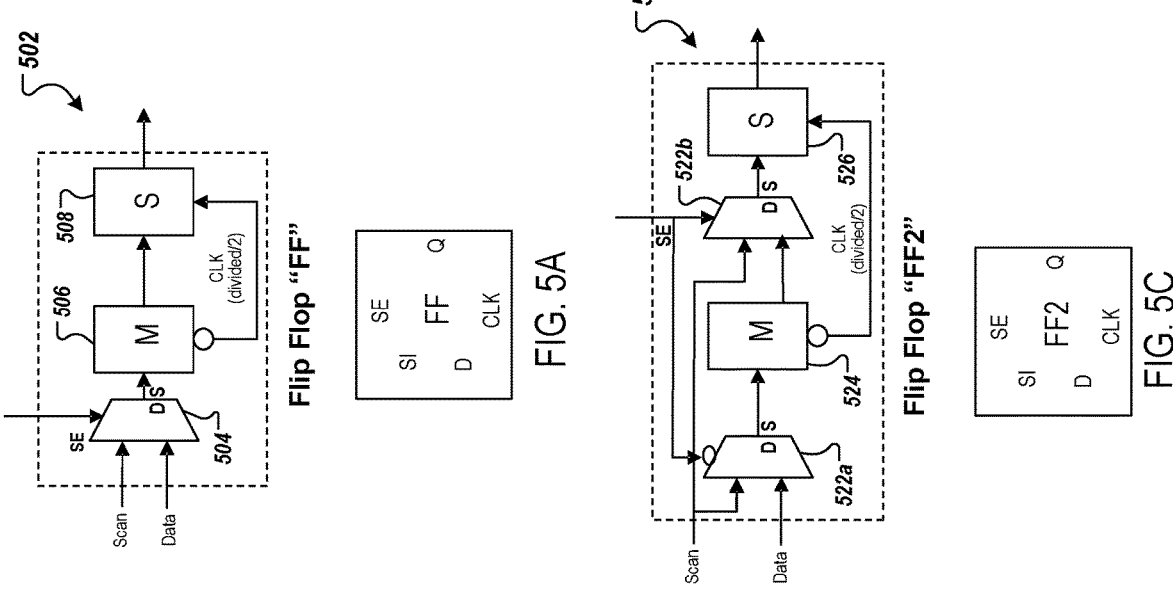
FIG. 5A
FIG. 5C

Radix Timing Diagram 650

700

RECEIVE A SET OF VALUES THAT REPRESENTS A PARTICULAR DATA PATTERN

702

GENERATE A FIRST DATA SIGNAL USING AT LEAST A PORTION OF THE VALUES IN THE SET OF VALUES, WHERE THE FIRST DATA SIGNAL HAS A FIRST FREQUENCY

704

USE A FIRST SERIES OF LATCHES AND A SECOND SERIES OF LATCHES TO EXTRACT ALTERNATING VALUES OF THE AT LEAST PORTION OF VALUES FROM THE FIRST DATA SIGNAL, WHERE THE FIRST SERIES OF LATCHES AND THE SECOND SERIES OF LATCHES EXTRACT THE ALTERNATING VALUES AT A SECOND FREQUENCY THAT IS A FRACTION OF THE FIRST FREQUENCY

706

COMBINE AN OUTPUT OF THE FIRST SERIES OF LATCHES WITH AN OUTPUT OF THE SECOND SERIES OF LATCHES TO GENERATE A SECOND DATA SIGNAL, WHERE THE SECOND DATA SIGNAL HAS THE FIRST FREQUENCY

HIGH-THROUGHPUT SCAN ARCHITECTURE

CROSS-REFERENCE TO RELATED APPLICATION

This application is a National Stage Application under 35 U.S.C. § 371 and claims the benefit of International Application No. PCT/US2022/011310, filed Jan. 5, 2022, the disclosure of which is incorporated herein by reference.

TECHNICAL FIELD

This specification relates to scan architectures and techniques for using scan architectures.

BACKGROUND

Mobile computing devices, such as smart phones, personal digital assistants, electronic tablets, laptops, and the like, all rely on circuits that function as designed. Due to flaws in the manufacturing process, some integrated circuits do not function as designed. Manufacturing or production tests can be performed to verify that circuits were manufactured correctly and to identify circuits that are faulty. Because these tests often must be performed on thousands or even millions of chips or chipsets, significant power and processing resources are spent performing them. Therefore, any inefficiencies in the testing process introduce substantial losses in the form of wasted power and processing resources. The time required for testing and quality assurance can also create a bottleneck for production lines.

SUMMARY

This specification describes technologies for a high-throughput scan architecture for testing digital devices. The techniques can be particularly useful for performing quality assurance and testing of integrated circuits at the end of manufacturing. The scan architecture can be implemented on electronic devices such as computer processors and be used to determine whether the electronic devices are functioning properly or are defective.

The scan architecture can include multiple scan chains that each include multiple series of latches. For example, each scan chain of the high-throughput scan architecture can include a first series of latches that make up a first series and a second series of latches that make up a second series. The first series of latches and the second series of latches can operate concurrently (e.g., in parallel), with each series of latches storing alternating values from a scan-in data signal. As a result the first and second series register different sets of values from a test pattern provided by a testing system. For example, both series of latches can be coupled to an input line that provides the test pattern as a sequence of values. Each series of latches can be arranged to store every other value that occurs in the sequence, so that they alternate which series of latches stores the next value. A delay element can be used for one series of latches, thus providing an offset so that the two series of latches each store a different portion of the input test pattern. In other words, the first series of latches stores the first input value, the second series of latches stores the second input value, the first series of latches stores the third input value, the second series of latches stores the fourth input value, and so on. In this manner, the test pattern sequence is distributed among the two series of latches in the scan-in phase.

Later, after testing is performed, the values in the two series of latches are output by the two series of latches in a scan-out phase, and the values from the two series of latches are interspersed or interleaved together to form the output sequence of the scan-out phase. For example, a selector can compose the output sequence by taking values from the different series of latches in turn, switching between the two series of values for each additional output value in the sequence. In other words, the output sequence can be a first value from the first series of latches, a first value from the second series of latches, a second value from the first series of latches, a second value from the second series of latches, and so on. In this manner, (1) at scan-in, the input sequence for the scan chain is dispersed between the different series of latches, with values being stored in alternating fashion in different series of latches, and (2) at scan-out, the output sequence is formed by interleaving outputs of the different series of latches.

The series of latches can operate at a frequency that is lower than other components of the scan architecture. For example, the first and second series of latches can operate at a clock rate that is half the data rate of the scan-in data signal during a test or shift mode. In this mode, both series of latches can operate by storing values (e.g., receiving values at scan in or shift in), such as those obtained from the scan-in data signal, and releasing values (e.g., outputting during scan out or shift out) at the at divided clock rate.

The testing system can select a test pattern to provide as an input to the scan architecture during testing of an electronic device. The test pattern can include one or more bit streams that are used to load data into the latches of the scan chains in the scan architecture. The test pattern can also include or be part of a testing program that provides inputs for the scan chains and timing parameters for the inputs. For example, in performing a test on a device, the testing system can select a test pattern for loading the latches of the scan chains on the device and a program to use to perform the test. The program can specify the scan-enable (SE) inputs for the latches of the scan chains—e.g., to toggle between a shift mode and a functional or capture mode for the series of latches in the scan chain—and the timing for providing the inputs. After providing the test pattern as an input and enabling capture or functional mode for one or more clock cycles, the testing system can switch the series of latches back to shift mode to shift out the stored values. The shifted out values can represent the test output that the testing system can compare a reference output to determine whether the electronic device is functioning properly or is defective. For example, if the test output does not match the reference output, the testing system can determine that the electronic device is defective or requires further analysis.

In one general aspect, an electronic device includes: a clock system that provides multiple clock signals including a first clock signal at a first frequency and a second clock signal at a second frequency that is less than the first frequency; a decompressor configured to receive the first clock signal and provide scan-in input values a first data rate based on the first frequency of the first clock signal; a scan chain includes a two distinct sets of latches provided as a first series of latches and a second series of latches that operate using the second clock signal, the scan chain being configured to (i) distribute the scan-in input values between the first series of latches and the second series of latches and (ii) combine values from first series of latches and the second series of latches to provide scan-out output values; and a compressor configured to receive the first clock signal and obtain the scan-out output values from the scan chain.

In another general aspect, an electronic device includes: a clock controller that provides multiple clock signals including a first clock signal at a first frequency and a second clock signal at a second frequency that is less than the first frequency; a decompressor configured to receive the first clock signal and provide a first data signal having a set of values, where the decompressor is configured to output the values of the first data signal at a first data rate based on the first frequency of the first clock signal; a scan chain includes a two distinct sets of latches provided as a first series of latches and a second series of latches, where the first series of latches and the second series of latches are both configured to receive the first data signal but capture different subsets of values from the first data signal, where first series of latches and the second series of latches both receive the second clock signal and capture values from the first data signal at a second data rate based on the second frequency of the second clock signal, and where the scan chain is configured to generate a second data signal by combining an output of the first series of latches with an output of the second series of latches; and a compressor configured to receive the first clock signal and obtain the second data signal from the scan chain, where the compressor is configured to obtain the second data signal from the scan chain at the first data rate in accordance with the first frequency using the first clock signal.

Implementations include one or more of the following features. For example, in some implementations, extracting the different subsets of values of the set of values from the first data signal includes alternating, for each value in the set of values, which of the two series of latches captures the value.

In some implementations, extracting the different subsets of values of the set of values from the first data signal includes: capturing, by the first series of latches, every other value of the first data signal; and capturing, by the second series of latches, the other values of the first data signal that were not captured by the second series of latches.

In some implementations, generating the second data signal includes interleaving the output of the first series of latches with the output of the second series of latches.

In some implementations, the electronic device includes a multiplexer configured to receive the output of the first series of latches, the output of the second series of latches, and the first clock signal, where generating the second data signal includes controlling the multiplexer to alternate between sampling the output of the first series of latches and the output of the second series of latches at the first frequency of the first clock signal.

In some implementations, the scan chain includes an element in one of the series of latches that introduces a timing difference between when the first series of latches are able to capture values from the first data signal and when the second series of latches are able to capture values from the first data signal.

In some implementations, the timing difference is equivalent to one cycle of the first clock signal.

In some implementations, the element is a lockup latch and the other latches of the first series of latches and the second series of latches are flip-flops.

In some implementations, the element is a first latch in the first series of latches such that any value captured by the first series of latches is loaded into the element or passed through the element before any other latch in the first series of latches, or the element is a first latch in the second series of latches such that any value captured by the second series of latches is loaded into the element or passed through the element before any other latch in the second series of latches.

In some implementations, the element is a flip-flop of a first type and the other latches of the first series of latches and the second series of latches are flip-flops of a second type.

In some implementations, the flip-flop of the first type is a master-slave flip-flop with a master bypass; and the flip-flops of the second type are master-slave flip-flops without a master bypass.

In some implementations, the element introduces a timing offset between the first series of latches and the second series of latches; and the scan chain includes a second element that removes the timing offset between the first series of latches and the second series of latches.

In some implementations, the element and the second element are both part of the first series of latches; or the element and the second element are both part of the second series of latches.

In some implementations, the second element is a last latch in the first series of latches such that any value captured by the first series of latches must pass through each of the other latches in the first series of latches before reaching the second element; or the second element is a last latch in the second series of latches such that any value captured by the second series of latches must pass through each of the other latches in the second series of latches before reaching the second element.

In some implementations, the second frequency is a division of the first frequency such that the second frequency is equal to the first frequency divided by two raised to an integer greater than zero.

In some implementations, the integer is one; and the second frequency is one half of the first frequency.

In some implementations, the integer is two; and the second frequency is one fourth of the first frequency.

In some implementations, the clock controller includes a frequency divider that receives the first clock signal and outputs the second clock signal based on the first clock signal.

In some implementations, the frequency divider is a programmable frequency divider that is configured to output a variable clock signal at a frequency that is dependent on a programmed state of the programmable frequency divider; and the second clock signal is a variable clock signal having the second frequency that is based on the programmed state of the programmable frequency divider.

In some implementations, the decompressor provides the first data signal in response to the electronic device receiving one or more inputs that enable a shift mode of the electronic device.

In some implementations, the electronic device receives one or more second inputs that disable the shift mode of the electronic device; and the scan chain is configured to generate the second data signal in response to the electronic device receiving one or more third inputs that re-enable the shift mode of the electronic device.

In another general aspect, an electronic device includes: a clock controller that provides multiple clock signals including a first clock signal at a first frequency, a second clock signal at a second frequency that is less than the first frequency, and a third clock signal at a third frequency that is less than the first frequency and the second frequency; a decompressor that receives the first clock signal and provides a first data signal having a set of values, where the decompressor is configured to output the values of the first data signal at a first data rate based on the first frequency of the first clock signal; a scan chain includes four distinct groups of latches provided as a first group of latches, a second group of latches, a third group of latches, and a fourth group of latches, where each of the four distinct groups of latches have a first series of latches and a second series of latches, where the first series of latches and the second series of latches of the first group of latches are both configured to: receive the first data signal but capture different subsets of values from the first data signal; and receive the second clock signal and capture values from the first data signal at a second data rate based on the second frequency of the second clock signal; where the first series of latches and the second series of latches of the second group of latches are both configured to: receive the output of the second series of latches of the first group of latches; and receive the third clock signal and capture values from the output of the second series of latches of the first group of latches at a third data rate based on the third frequency of the third clock signal; where the first series of latches and the second series of latches of the third group of latches are both configured to: receive the output of the first series of latches of the first group of latches; and receive the third clock signal and capture values from the output of the first series of latches of the first group of latches at a third data rate based on the third frequency of the third clock signal; and where the first series of latches and the second series of latches of the fourth group of latches are both configured to: receive a second data signal containing outputs of the second group of latches and outputs of the third group of latches; and receive the second clock signal and capture values from the second data signal at a second data rate based on the second frequency of the second clock signal; where the scan chain is configured to generate a third data signal by combining an output of the first series of latches of the fourth group of latches with an output of the second series of latches of the fourth group of latches; and a compressor that receives the first clock signal and obtains the third data signal from the scan chain, where the compressor is configured to obtain the third data signal from the scan chain at the first data rate in accordance with the first frequency using the first clock signal.

In another general aspect, a method includes receiving a set of values that represents a particular data pattern; generating a first data signal using at least a portion of the values in the set of values, wherein the first data signal has a first frequency; using a first series of latches and a second series of latches to extract alternating values of the at least portion of values from the first data signal, where the first series of latches and the second series of latches extract the alternating values at a second frequency that is a fraction of the first frequency; and combining an output of the first series of latches with an output of the second series of latches to generate a second data signal, where the second data signal has the first frequency.

Other embodiments of these aspects include corresponding systems and apparatus configured to perform the actions of the method.

The subject matter described in this specification can be implemented in particular embodiments so as to realize one or more of the following advantages. For example, the described scan architecture can achieve improved dynamic power consumption. This benefit is achieved, at least in part, through the design of the scan chains and the clock network employed in the scan architecture. By using scan chains that include two or more series of latches and by reducing the frequencies that the series of latches operate at (e.g., the frequency that the latches store and release bits at), the dynamic power used by the scan architecture while in a test mode (e.g., shift mode as opposed to a functional mode) is reduced.

The dynamic power savings provided by the scan architecture are achieved, at least, through the reduction of dynamic power used in the clock network and reduction of dynamic power used in the latches of the scan chains of the scan architecture. First, the frequency that the series of latches in the scan architecture operate at can be a division(s) of the frequency that other components of the scan architecture operate at. As a result, the dynamic power of the clock network is substantially divided. Second, because the latches of the scan chains in the scan architecture operate at the divided frequency or frequencies, the clock-related dynamic power used inside the latches is reduced.

In using multiple series of latches in each scan chain, the scan architecture can achieve reduced dynamic power without increasing test time. In more detail, using multiple series of latches that operate at a frequency that is a division of a frequency that other components of the scan architecture operate at counters any increase or significant increase in test time that would otherwise be expected from reducing the frequency that the latches operate at. This is because the bits of the incoming data signal are divided among the two or more series of latches of the scan chain. For example, if the latches in the scan architecture operate at half of a clock controller's undivided clock rate, then the scan architecture can continue to produce an output data signal at the undivided clock rate by using scan chains that each include two series of latches. Accordingly, the scan architecture provides the additional benefit of reducing dynamic power without increasing or significantly increasing test times, thereby improving testing efficiency.

BRIEF DESCRIPTION OF THE DRAWINGS

FIGS. 5A-5D are diagrams of different latches that can be used in a scan chain of a high throughput scan architecture.

FIG. 7 is a flowchart of an example process for using a high throughput scan architecture.

Like reference numbers and designations in the various drawings indicate like components.

DETAILED DESCRIPTION

Figure 1:
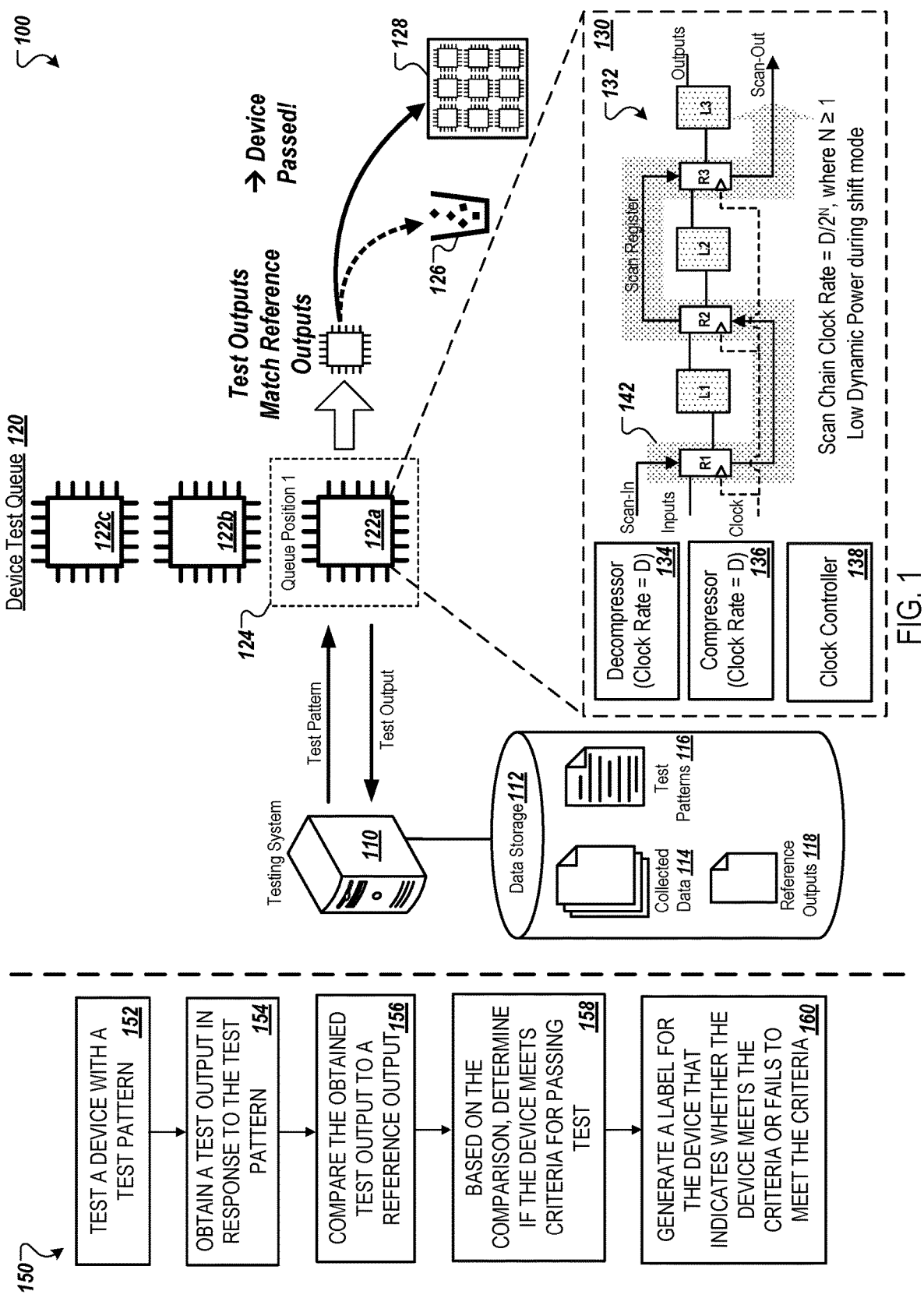
FIG. 1 is a diagram of an example system for testing electronic devices that have a high throughput scan architecture.

FIG. 1 is a diagram of an example system 100 for performing testing of electronic devices. These electronic devices can be circuits. For example, the electronic devices can be or include processing devices, such as processors (CPUs), processor cores (CPU cores), or microprocessors. The system 100 can include a testing system 110 that can access data storage 112. The system 100 can also include a device testing queue 120 that includes one or more electronic devices 122a-122c to be tested by the testing system 110. Each of the electronic devices 122a-122c in the device test queue 120 contain a high throughput scan architecture 130 that includes at least one scan chain, a decompressor, a compressor, and a clock controller. For example, the electronic device 122a includes a scan chain 132, a decompressor 134, a compressor 136, and a clock controller 138.

The scan architecture 130 can be implemented on electronic devices such as computer processors and be used to determine whether the electronic devices are functioning properly or are defective. The scan architecture 130 can include multiple scan chains that each include multiple series of latches. For example, each scan chain of the high throughput scan architecture 130 can include a first series of latches that make up a first series and a second series of latches that make up a second series. The first series of latches and the second series of latches can operate concurrently (e.g., in parallel) by shifting-in alternating sets of values from a scan-in data signal such that first series of latches and the second series of latches register different data sets from a test pattern provided by the testing system 110. These series of latches can operate at a frequency that is lower than other components of the scan architecture. For example, the first and second series of latches can operate at a clock rate that is a division the data rate of the scan-in data signal during a test or shift mode. Specifically, the clock rate can be equal to the data rate divided by a power of two with a non-zero integer. In this test or shift mode, both series of latches can operate by storing (e.g., scan or shift in) values, such as those obtained from the scan-in data signal, and releasing (e.g., scan or shift out) values at the at divided clock rate.

In more detail, one or more components of the scan architecture 130 can receive a first clock signal that has a first frequency. These one or more components can, for example, provide inputs to the first series of latches and the second series of latches at the first frequency. The first series of latches and the second series of latches can receive a second clock signal that has a second frequency that is a division of the first frequency. The second frequency can be equal to the first frequency divided by a power of two with a non-zero integer. For example, the second frequency can be equal to one-half the first frequency, one-fourth the first frequency, or one-eighth the first frequency. The first series and second series of latches can operate at the second frequency to capture alternating inputs provided by the one or more components.

The scan architecture 130 of the electronic devices can provide a number of benefits to improve the testing of electronic devices. These benefits can included reduction of dynamic power consumption during electronic device testing and are achieved, at least in part, through the design of the scan chains and the clock network employed in the scan architecture 130. As will be discussed in more detail below with respect to FIGS. 2 and 4, the scan chains in the scan architecture 130 can each include two or more series of latches that operate at lower frequencies than other components of the scan architecture 130. By reducing the frequencies that the series of latches operate at (e.g., the frequency that the latches store and release bits at), the dynamic power used by the scan architecture 130 while in a test mode (e.g., shift mode as opposed to a functional mode) is reduced. The dynamic power savings provided by the scan architecture 130 are achieved, at least, through the reduction of dynamic power used in the clock network and reduction of dynamic power used in the latches of the scan chains of the scan architecture 130. First, the frequency that the series of latches in the scan architecture 130 operate at can be a division(s) of the frequency that other components of the scan architecture 130 such as the decompressor 134 and the compressor 136 operate at. When the scan chains of the scan architecture 130 each have two series of latches, the operation frequency for the clock network is divided by two during shift mode. As a result, the dynamic power of the clock network is substantially halved. Second, because the latches of the scan chains in the scan architecture 130 operate at the divided frequency or frequencies, the clock-related dynamic power used inside the latches is reduced.

In using multiple series of latches in each scan chain, the scan architecture 130 can achieve reduced dynamic power without increasing test time. In more detail, using multiple series of latches that operate at a frequency that is a division of a frequency that other components of the scan architecture 130 operate at counters any increase or significant increase (e.g., increase greater than or equal to one cycle, two cycles, or three cycles of the decompressor 134's output data rate which can be equal to the clock controller 138's undivided clock rate D) in test time that would otherwise be expected from reducing the frequency that the latches operate at. This is because the bits of the incoming data signal are divided among the two or more series of latches of the scan chain. For example, a first series of the scan chain 132 can receive, store, and release all bits provided by the decompressor 134 as a data signal that are in an even position of the data signal, and a second series of the scan chain 132 can receive, store, and release all the remaining bits. That is, the second series of the scan chain 132 can receive, store, and release all bits provided by the compressor 136 as the data signal that are in an odd position of the data signal. If the latches in the scan architecture 130 operate at half the clock controller 138's undivided clock rate D (e.g., operate at a clock rate of D/2), then the scan architecture 130 can continue to produce an output data signal at the undivided clock rate D by using scan chains that each include two series of latches. Accordingly, the scan architecture 130 provides the additional benefit of reducing dynamic power without increasing or significantly increasing test times, thereby improving testing efficiency.

The scan architecture 130 includes various components. As shown, the scan architecture 130 includes the decompressor 134 that is designed to drive the loading of values into the scan chains of the scan architecture 130, including the scan chain 132. The decompressor 134 can be on-chip decompressor such that it is located on the device being tested, here the electronic device 122a. Each of the other electronic devices in the device test queue 120 can include a decompressor that is similar to the decompressor 134 of the electronic device 122a.

As will be discussed in more detail below, the testing system 110 can initiate a scan chain test by providing a test pattern such as a test input bit streams to the electronic devices in the device test queue 120. The test pattern provided by the testing system 110 is used to initialize the scan chains in the scan architecture. That is, the test pattern is used to set the data state for certain parts of the electronic device 122a during a scan-in phase or shift-in mode of the electronic device 122a. As will be discussed in more detail below, the test pattern can also control the mode of the electronic device 122a and the switching between different modes to perform the scan chain test.

In more detail, when the electronic device 122a receives a test pattern from the testing system 110 on the scan-in line of the scan architecture 130, the decompressor 134 can use the test pattern to load values into the scan chains of the scan architecture 130 including the scan chain 132. To load the values, the decompressor 134 can be used to generate data signals that are provided to the scan-in lines of the scan chains. For example, the decompressor 134 can receive a first clock signal from the clock controller 138 and use this signal to generate the data signal(s) from the test pattern and provide the data signal at a data rate that is equivalent to the clock rate of the first clock signal or is a division of the clock rate. For example, the decompressor 134 can receive the undivided clock signal from the clock controller 138 that has a clock rate of D. The decompressor 134 can proceed to output the test input bit streams of the test pattern at the clock rate of D, such that each scan chain of the scan architecture 130 is fed one bit per clock cycle at the clock rate D.

The scan chain 132 includes memory elements such as latches (e.g., flip-flops) that are stitched together to form the scan chain. These memory elements are represented as registers R1, R2, and R3. The scan chain 132 can also include logical components that are represented as L1, L2, and L3. The scan chain 132 can operate in a test or shift mode (e.g., scan-in state) that follows a scan path 142 and a functional mode (e.g., capture state) that follows a functional path. As will be discussed in more detail with respect to FIGS. 2, 4, and 6A-6B, the scan chain of the scan architecture 130 can include a first series of latches that make up a first series of latches and a second series of latches that make up a second series of latches. The first series of latches and the second series of latches can operate concurrently by shifting-in alternating sets of values (e.g., being driven by the decompressor 134) from a scan-in data signal such that first series of latches and the second series of latches register different data sets from the test pattern provided by the testing system 110. For example, the first series of latches may store every other bit in a data signal provided by the decompressor 134 while the second series of latches stores every remaining bit in the data signal.

The scan chain 132 can receive a second clock signal from the clock controller 138 that has a clock rate that is a division of the clock rate D provided to the decompressor 134 and the compressor 136. The clock rate of the second clock signal can be represented as $D/2^N$, wherein N is any integer greater than 0. The latches of the scan chain 132 can receive and operate at this lower clock rate. In operating at the clock rate $D/2^N$, the first series of latches and the second series of latches store (e.g., scan or shift in) values, such as those obtained from the scan-in data signal driven by the decompressor 134, and releasing (e.g., scan or shift out) values at the $D/2^N$ clock rate.

The scan chains in the scan architecture 130 can receive multiple clock signals from the clock controller 138. For example, different components of the scan chain 132 can receive and operate at different clock signals provided by the clock controller 138. In more detail, one or more first components of the scan chain 132 can receive a first clock signal that has the clock rate D and one or more other components of the scan chain 132 can receive a second clock signal that has the clock rate $D/2^N$. For example, the clock controller 138 can provide a first clock signal with a clock rate D to a multiplexer (MUX) of the scan chain 132 and a second clock signal with a clock rate $D/2^N$ to two series of latches of the scan chain 132. While the series of latches can shift-out there stored values at the rate $D/2^N$, the MUX can operate at the rate D to combine the shifted-out values from both series to generate an output data signal for the scan chain 132. In combining the outputs of the two series of latches, the MUX can interleave the outputs of a first series of latches with the outputs of a second series of latches such that every other bit in the output signal was obtained from the first series of latches and the remaining bits in the output signal were obtained from the second series of latches.

The scan chains in the scan architecture 130 can use multiple divided clock rates. As will be discussed in more detail below with respect to FIGS. 6A-6B, the scan chains of the scan architecture 130 can sometimes include more than two series of latches. For example, the scan architecture 130 may include scan chains that each include eight series of latches. Four of the series of latches can receive and operate at a clock rate D/2. However, the remaining four series of latches can receive and operate at a lower clock rate such as a clock rate D/4.

The compressor 136 can receive the outputs of the scan chains of the scan architecture 130 and combine them to generate a test output. For example, the compressor 136 may obtain values that represent the outputs of the scan chains in the scan architecture 130 and combine them to generate a signal on the scan-out line of the scan architecture that represents the test output or can be used by the testing system 110 to extract the test output. The compressor 136 can operate at a higher clock rate than the latches of the scan chain 132. For example, the compressor 136 can receive a clock signal from the clock controller 138 that has a clock rate of D and operate at the clock rate D by reading the output value of each of the scan chains in the scan architecture 130 on the rising edge of the clock signal that has the clock rate D. The compressor 136 can receive the same clock signal that the decompressor 134 receives and operate at the same clock rate as the decompressor 134. The test output generated by the compressor 136 can be bit streams provided on a scan-out line of the scan architecture 130.

The test output is based on the test pattern provided by the testing system 110. For example, each bit the test pattern may have a corresponding bit in the test output. An input bit may correspond to an output bit, for example, based on the position of the input bit in the test pattern and the position of the output bit in the test output. For example, an input bit may correspond to an output bit based on the particular bit stream of the test pattern that the input bit is located in (e.g., which can dictate which scan chain will be loaded with the input bit), position of the input bit in its respective bit stream (e.g., which can dictate which latch in the scan chain the input bit will be loaded when functional mode is enabled), the particular bit stream of the test output that the output bit is located in (e.g., which can indicate which scan chain the output bit was shifted out from, and the position of the output bit in the respective bit stream (e.g., which can indicate which latch in the scan chain the output bit was shifted out from immediately following switch from functional mode to shift mode). Also, each bit stream of the test pattern can have a corresponding bit stream in the test output. An input bit stream of the test pattern can have a corresponding bit stream of the test output, for example, based on the particular scan chain in the scan architecture 130 that was loaded with the input bit stream and converted it into the output bit stream.

The clock controller 138 can be an on-chip clock controller that is configured to provide one or more clock signals to different components of the scan architecture 130. For example, the clock controller 138 can provide a first clock signal having a clock rate D to the decompressor 134 and the compressor 136, and a second clock signal having a divided clock rate of $D/2^N$ to the latches of the scan chain 132.

The testing system 110 can include one or more computers or other computing devices, such as desktop computer(s), laptop computer(s), server(s), or mobile device(s) such as smart phone(s) or tablet(s). The testing system 110 may be part of cloud computing environment. The testing system 110 can include or have access to the data storage 112.

The data storage 112 may be local to the testing system 110, such as internal memory. Alternatively, the data storage 112 may be remote, such as part of a cloud computing environment that the testing system 110 can access.

The testing system 110 can test electronic devices to determine if they function as designed or were properly manufactured. The testing system 110 can initiate a test on an electronic device in the device test queue 120 after it is placed in the testing position 124. For example, the testing system 110 can start a test of the electronic device 122a in response to being placed in the testing position 124 or being assigned the testing position 124.

In initiating a test of an electronic device, the testing system 110 can select a test pattern to provide as an input to the scan architecture of the electronic device. The test pattern can include one or more bit streams that are used to load the latches of the scan chains in the scan architecture. Each of these bit streams can be represented as a vector. The test pattern can also include or be part of a testing program that provides inputs for the scan chains and timing parameters for the inputs. For example, in performing a test on the electronic device 122a, the testing system 110 can select a test pattern for loading the latches of the scan chains on the electronic device 122a including the scan chain 132. The testing system 110 may also select a test program to use to perform the test. The test program can specify the scan-enable (SE) inputs for the latches of the scan chains, e.g., to switch the series of latches in the scan chain between a shift mode and a functional mode, and the timing for providing the inputs. After providing the test pattern as an input and enabling functional mode for a number of clock cycles, the testing system 110 can switch the series of latches back to shift mode to shift out the stored values. The shifted out values can represent the test output that the testing system 110 can acquire from a scan-out line of the scan architecture 130. After obtaining the test output, the testing system 110 can compare the test output to a reference output from the reference outputs 118 to determine whether the electronic device is functioning properly or is defective. For example, if the test output does not match the reference output or diverges more than a permissible amount from the reference output, the testing system 110 can determine that the electronic device 122a is defective or requires further analysis.

The testing system 110 can select a particular test pattern from the test patterns 116 based on one or more factors. These factors can include structural parameters of the electronic device being tested. For example, the testing system 110 can select a specific test pattern based on the design the scan architecture of the electronic device being tested. As another example, the testing system 110 can select a specific test pattern based on the particular electronic device being tested or the type of electronic device being tested (e.g., which may indicate scan architecture design used by the electronic device being tested). In more detail, the testing system 110 may select a Test Pattern A for the electronic device 122a based the model of the electronic device 122a. The model of the electronic device 122a can indicate, for example, that the scan chains in the scan architecture 130 have a bit-size of 8 (e.g., each scan chain of the scan architecture 130 includes eight latches that are each configured to store a 1-bit value at a time) and, therefore, the number of bits required to load the scan chains with values for testing. Based on this, the testing system 110 can select the Test Pattern A from the test patterns 116 that includes bit streams with the requisite bit-size (e.g., eight bits) to enable the loading of all latches of the scan chains of the scan architecture 130 with a bit value from the Test Pattern A.

The factors can include types of errors, types of defects, or performance areas that an electronic device is to be tested for. For example, the testing system 110 may select a particular test pattern from the test patterns 116 based on a determination that a stuck-at test should be performed on the electronic device 122a. The particular test pattern may be designed to test the electronic device 122a for either stuck-at-1 or stuck-at-0 logic behavior that is indicative of a defective gate. As another example, the testing system may select a different test pattern from the test patterns 116 based on a determination that an at-speed test should be performed on the electronic device 122a. This test pattern can be designed to test the electronic device 122a for defects in node timing, such as slow-to-rise and slow-to fall faults. Other test patterns in the test patterns 116 can be designed for other tests such as path delay tests (e.g., for the testing of particular, specified paths through the performance of at-speed tests on these critical paths), IDDQ tests (e.g., for the testing of CMOS integrated circuits for the presence of manufacturing faults as indicated by the presence of excess draw of current), N-detect and embedded multiple detect tests (e.g., for the testing of multiple faults that are randomly targeted), deterministic bridging tests (e.g., for the identifying of net pairs that have the potential of bridging and whose faults that would not be detected with other test patterns), small-delay defects tests (e.g., for the testing of the longest paths to detect small-delay defects), etc. In some implementations, a test pattern may be designed or applicable for multiple types of tests.

The testing system 110 can determine the type of error, the type of defect, or the performance area that an electronic device is to be tested for and select a test pattern from the test patterns 116 based on the determination. For example, a user of the testing system 110 may specify all the defect test types that should be performed on all electronic devices of Model X. In response to determining that the electronic device 122a is an electronic device of Model X, the testing system 110 can inspect a data object for the electronic devices of Model X that provides that each device of Model X should undergo an at-speed test. Based on the Model X devices having scan architectures with scan chains with a bit-size of four and the indication that an at-speed test should be performed, the testing system 110 can select a Test Pattern B from the test patterns 116 that is designed to load four bits into scan chains and to reveal whether stuck-at-1 or stuck-at-0 logic behavior is present in the electronic device being tested.

As another example, the testing system 110 can determine the type of error, the type of defect, or the performance area that an electronic device is to be tested for based on the attributes of the electronic device, such as the structural attributes of the electronic device. These attributes can include the node size of the electronic devices, historically common defects for the model or manufacturer of the electronic devices, the intended use or acceptable quality level for the electronic devices, etc. For example, by default, the testing system 110 may perform stuck-at and at-speed tests for all electronic devices in the device test queue 120. However, if an electronic device includes design nodes of 90 nm or smaller, the testing system 110 may determine that a small-delay defects test should also be performed. Prior to testing an electronic device, the testing system 110 may refer to a lookup table to identify the test patterns to use, types of tests to be performed, types of defects or errors that should be identified, or rules for identifying any of the prior.

In some implementations, the testing system 110 selects multiple test patterns to use when testing a single electronic device. For example, in testing the electronic device 122a, the testing system 110 may select a first test pattern from the test patterns 116 to test the electronic device 122a for proper timing performance and a second test pattern from the test patterns 116 to test the electronic device 122a for stuck-at-1 or stuck-at-0 logic behavior. In response to performing a test with the two different test patterns, the testing system 110 can acquire two test outputs.

In some implementations, the testing system 110 selects multiple reference outputs to use when testing a single electronic device. Continuing the earlier example, the testing system 110 can select a first reference output from the reference outputs 118 based on the first test pattern and a second reference from the reference outputs 118 output based on the second test pattern. The testing system 110 can compare the first reference output with the first test output (e.g., to see if they match) and the second reference output with the second test output (e.g., to see if they match). If the first comparison reveals that the first test output did not match the first reference output or was not sufficiently similar to the first reference output, the testing system 110 can determine that there is a defect with the timing performance of the electronic device 122a. If the second comparison reveals that the second test output did not match the second reference output or was not sufficiently similar to the second reference output, the testing system 110 can determine that there is a defect with the logic behavior of the electronic device 122a.

In selecting a test pattern to use for testing an electronic device in the test queue 120, the testing system 110 can access the data storage 112 and select a test pattern from the test patterns 116. As mentioned above, the test pattern selected by the testing system 110 can be based on the attributes of the electronic device being tested, the type of test that is to be performed, or the defects that are to be identified.

In selecting a reference output to use for comparison with the test output, the testing system 110 can access the data storage 112 and select a reference output from the reference outputs 118. The reference output selected by the testing system 110 can depend on the selected test pattern. For example, a particular test pattern may have a corresponding reference output or a set of corresponding reference outputs (e.g., where selection from among the set depends on other factors such as the model of the electronic device tested). The reference output selected can also depend on the electronic device being tested. For example, the reference output selected by the testing system 110 may be specific to the type of electronic device that the electronic device 122a is, the model of the electronic device 122a, the bit size of the scan chain 132 (e.g., number of latches in the scan chain 132), the manufacturer or designer of the electronic device 122a, or other attributes of the electronic device 122a.

Instead of selecting a test pattern, the testing system 110 can automatically generate a test pattern. For example, the testing system 110 can use automatic test pattern generate to test the electronic device 122a. The method that the testing system 110 uses to generate the test pattern can depend on the types of test(s) that are to be performed on the electronic device 122a or the types of defects that are to be ruled out for the electronic device 122a.

If the testing system 110 automatically generates a test pattern, the testing system 110 may automatically generate a corresponding reference output based on the test pattern. For example, using generated test pattern and the attributes of the electronic device 122a, the testing system 110 can generate an array or vector of values that represent the expected test output of the electronic device 122a assuming that it is functioning properly.

The testing system 110 may obtain test outputs by capturing values detected on the scan-out line of the scan architecture 130 after a threshold amount of time (e.g., based on the clock rate) or a threshold number of clock cycles have passed since the test pattern was provided as an input on the scan-in line or since mode of the scan chains were switched from a functional to a shift mode. For example, if the scan architecture 130 includes scan chains that have a bit-size of eight, the testing system 110 may obtain a test output for the electronic device 122a by storing the values read on the scan-out line of the scan architecture 130 for eight clock cycles at the clock rate D after the testing system 110 disables functional mode and enables shift mode (e.g., by setting scan enable on the latches of the scan chains to 1). Alternatively, the testing system 110 can obtain a test output for the electronic device 122a by storing the values read on the scan-out line of the scan architecture 130 for eight clock cycles at the clock rate D after the testing system 110 reads the first value on the scan-out line.

In comparing test outputs to reference outputs to determine whether electronic devices have any defects, the testing system 110 may apply one or more rules that indicate whether the devices passed or failed the tests. The rules may require an exact match between reference outputs and the test outputs. The rules may additionally or alternatively define permissible divergences between reference outputs and test outputs. The rules may use a percent threshold or an absolute threshold to define permissible divergences between reference outputs and test outputs. For example, the test output obtained by the testing system 110 can include an array of values [0;0;1;0;1;1;0;1] and the reference output identified by the testing system 110 can include an array of values [0;1;0;0;1;1;0;0]. The testing system 110 determines that the second, third, and eighth values for the test output are different from the reference pattern, while other values match the corresponding values of the reference pattern. As a result, the testing system 110 can conclude that the electronic device 122a does not perform as designed or includes a defect and, therefore, fails the test.

The rules applied to the comparison results can depend on the parameters of the test or the attributes of the electronic device being tested. For example, the rules applied for determining whether the electronic device 122a passed or failed a test can be selected by the testing system 110 based on the test pattern used for the test, the type of test performed on the electronic device 122a (e.g., at-speed test, stuck-at test, etc.), or the intended use or acceptable quality level for the electronic device 122a. In more detail, the testing system 110 can apply a first set of rules that require exact matches between the test output of the electronic device 122a and a reference output if the test performed was a path delay test. However, if the testing system 110 were to perform an at-speed test on the electronic device 122a, the testing system 110 may apply a different set or rules that require only 95% of the values in the test output to match positionally related values in the reference output.

After determining that an electronic device has failed the test, the testing system 110 can notify one or more users of the testing system 110 of the failed test. For example, the testing system 110 may generate a notification that indicates that the electronic device 122*a* has failed the test or, more generally, that the electronic device in the first position 124 of the test queue 120 has failed the test. The notification can include additional information such as the results of the test. The results can include, for example, an indication of the test pattern used and an indication of the reference output used. The results can include the test output. The results can additionally or alternatively include information related to the comparison of the test output with the reference output. The testing system 110 can transmit this notification to a user of the testing system 110, e.g., through a dashboard, email notification, text message, etc. In response to receiving this notification, the user can respond with instructions to have the defective electronic device disposed of. For example, in response to receiving a notification from the testing system 110 indicating that the electronic device 122*a* has failed the test, the user can provide instructions to the testing system 110 to place the electronic device 122*a* into a disposal container 126. The testing system 110 may proceed by transmitting instructions to one or more robotic devices to dispose of the electronic device 122*a*.

After determining that an electronic device has failed the test, the testing system 110 can generate instructions to dispose of the electronic device. For example, the testing system 110 can generate instructions to have a robotic device such as robotic arm place the electronic device 122*a* into an area that includes defective devices or throw the electronic device 122*a* into a disposal container 126. Prior to generating the instructions or transmitting the instructions for disposal, the testing system 110 may request confirmation of disposal from an administrator or other user. Where the electronic device 122*a* is on a wafer with other electronic devices, the testing system 110 may avoid transmitting instructions to move or dispose of the electronic device 122*a* until after the other devices on the same wafer have been tested.

In response to determining that an electronic device failed the test, the testing system 110 can provide an indication that the tested electronic device failed the test or should be disposed of. For example, in response to determining that the electronic device 122*a* failed the test, the testing system 110 can update a data object that stores data related to the electronic device 122*a* to reflect that the electronic device 122*a* is defective. The testing system 110 can also generate and transmit a notification that includes the indication. For example, the testing system 110 can generate an electronic message that indicates that the electronic device 122*a* has failed the test and is defective. The electronic message may be electronically transmitted by the testing system 110 to an administrator, a manufacturer, or a designer of the electronic device 122*a*. The electronic message may include additional information regarding the results of the test, such as the test pattern that was used, the test output received, the results of the comparison of the test output with a reference output, or the parameters used to determine whether the electronic device passed or failed the test. The electronic message may contain a report for all electronic devices that share one or more attributes, such as all electronic devices that are on the same wafer.

The testing system 110 can take other actions if it determines that an electronic device has passed a test. For example, as shown, in response to determining that the electronic device 122*a* passed the test, the testing system 110 can generate instructions to have the device 122*a* placed in an area 128 with other properly functioning devices. Where the electronic device 122*a* is on a wafer with other electronic devices, the testing system 110 may avoid placing the device 122*a* in the area 128 until the other devices on the wafer are tested.

In response to determining that an electronic device passed the test, the testing system 110 can provide an indication that the tested electronic device passed the test or should be moved to an area for properly functioning devices. For example, in response to determining that the electronic device 122*a* passed the test, the testing system 110 can update a data object that stores data related to the electronic device 122*a* to reflect that the electronic device 122*a* is properly functioning. The testing system 110 can also generate and transmit a notification that includes the indication. For example, the testing system 110 can generate an electronic message that indicates that the electronic device 122*a* has passed the test and is properly functioning. The electronic message may be electronically transmitted by the testing system 110 to an administrator, a manufacturer, or a designer of the electronic device 122*a*. The electronic message may include additional information regarding the results of the test, such as the test pattern that was used, the test output received, the results of the comparison of the test output with a reference output, or the parameters used to determine whether the electronic device passed or failed the test. The electronic message may contain a report for all electronic devices that share one or more attributes, such as all electronic devices that are on the same wafer.

The testing system 110 can save all or a portion of the results of each test performed or the results of each test performed that concluded in a failure. The testing system 110 save all or a portion of these results as part of the collected data 114 in the data storage 112. For example, the test results for electronic devices that failed the test may be saved by the testing system 110 as part of the collected data 114 for further analysis as they may provide insight as to which parts of the electronic devices are not performing as designed, which step(s) during the manufacturing process likely caused the defect in the electronic device, or which manufacturing machines are most likely responsible for introducing the defect in the electronic device during manufacture.

The electronic devices in the device test queue 120 can each include an interface that the testing system 110 uses to provide testing patterns to the electronic devices and receive test results from the electronic devices. For example, the testing system 110 can use a testing interface or Test Access Port (TAP) of the electronic device 122*a* to provide a test pattern as input to the scan architecture 130 of the electronic device 122*a* and to receive test results from the electronic device 122*a* in response to the test pattern. The testing interface of the electronic devices can leverage the benefits of the scan architecture described herein by, for example, providing for data transfer in and out of the electronic devices at the undivided clock rate while power is saved as a result of the latch design of the scan architecture 130.

The testing interface of the electronic devices can be a standard interface, such as an interface having a test structure of the IEEE Std. 1149.1. The ability to use a standard testing interface can further improve efficiency in the testing system 110 testing the electronic devices. For example, the testing system 110 may not require customized testing parameters to test the electronic devices having the scan architecture 130 when a standard testing interface is use. This can provide the benefits of reducing or eliminating time spent determining testing parameters, and reducing testing time of the electronic devices by not having to change testing parameters (e.g., for devices having the scan architecture and for other devices, or for each of the devices having the scan architecture). The ability to use a standard testing interface can also provide additional benefits. These benefits can include reduced design time and production time of the electronic devices having the scan architecture 130. For example, circuit designers for the electronic devices having the scan architecture 130 do not need to provide user-inserted test structures for scan testing when a standard testing interface is used, which can be transparent (e.g., hidden or invisible) to the circuit designers.

The testing system 110 may place electronic devices in the device test queue 120. The testing system 110 may place electronic devices in the device test queue 120 as they are received, e.g., manufactured or scheduled for testing. Alternatively, the testing system 110 may place electronic devices in the device test queue 120 according to an electronic device hierarchy or a combination of hierarchy and the order in which the electronic devices are received. For example, the testing system 110 may be programmed to assign electronic devices of a particular model or type a higher priority than all other electronic devices (e.g., due to them being more critical at a particular time to fill a quota, due to them being a new design so as to reduce waste if the manufacture process is producing more than an acceptable percentage of defective devices, etc.). After an electronic device assigned the highest priority or a priority higher than any other electronic devices in the test queue 120 is manufactured, the testing system 110 may place the electronic device in a first position 124 for devices to be tested or in the next position for devices to be tested (e.g., when testing of an electronic device currently in the position 124 has already started).

The electronic devices 122a-122c may represent three CPUs on a silicon wafer that was recently manufactured and that contains 597 other CPUs. The device 122a may be, for example, the first CPU on the silicon wafer that was selected for testing.

The order of the electronic devices in the test queue 120 may depend on their location relative to the location of the first electronic device selected for testing and/or their location relative to the wafer (e.g., edge of wafer, first row of devices on wafer, first column of devices on wafer, etc.). For example, the electronic devices 122a-122c may all be found in a first, top row of electronic devices on the wafer. After the electronic device 122a is first selected for testing, the testing system 110 may place the electronic device 122b next in the test queue due to the electronic device 122b being the next CPU in the top row of CPUs after the electronic device 122a. Similarly, the testing system 110 may place the electronic device 122c next in the test queue to the electronic device 122c being the next CPU in the top row of CPUs after the electronic device 122b.

Moreover, the order of the electronic devices in the device test queue 120 may be predetermined, e.g., based on the locations of the electronic devices on a wafer. For example, the testing system 110 may follow a location order such that whichever electronic device is located in the first location is tested first, whichever electronic device is located in the second location is tested second, and so on.

As shown, FIG. 1 includes a flowchart of an example process 150 for testing electronic devices using a high throughput scan architecture. The process 150 can be performed, at least in part, using the testing system 110 described herein.

The process 150 includes testing a device with a test pattern (152). For example, the testing system 110 may obtain a test pattern from the test patterns 116 to provide as an input to the scan-in line of the scan architecture 130 of the electronic device 122a. The test pattern selected by the testing system 110 can be based on the particular electronic device being tested or the type of electronic device being tested. For example, the testing system 110 may select the test pattern to use for testing the electronic device 122a based on the make and model of the electronic device 122a.

The process 150 includes obtaining a test output in response to the test pattern (154). For example, the testing system 110 can read the test output on a scan-out line of the scan architecture 130 after providing the test pattern as an input on the scan-in line.

The process 150 includes comparing the obtained test output to a reference (156). For example, the testing system 110 can select a reference output from the reference outputs 118 based on the test pattern used for testing the electronic device 122a. The reference output selected by the testing system 110 can also depend on the particular device tested or the type of device tested.

The process 150 includes determining whether the device meets criteria for passing test based on the comparison (158). The criteria can define the extent at which the test output is permitted to deviate from the selected reference output. For example, the criteria for testing the electronic device 122a may provide that the test output must exactly match the reference output. The criteria used by the testing system 110 may depend on different factors. For example, a manufacturer may set first criteria for a first model of processor and second criteria that is different from the first criteria for a second model of processor. As another example, a manufacturer may set different criteria for the same model of processor based on the intended use of the individual processors or the third-party that ordered the individual processors. Where one processor of Model A is scheduled to be installed in a consumer laptop and a second processor of the same model, Model A, is scheduled to be installed in a satellite, the testing system 110 may select first criteria to be used when testing the first processor set for use in the consumer laptop and second, more stringent criteria to be used when testing the second processor set for use in the satellite.

The process 150 includes generating a label for the device that indicates whether the device meets the criteria or fails to meet the criteria (160). For example, in response to determining that the electronic device 122a passed the test, the testing system 110 can update a data object for the electronic device 122a to show that the electronic device 122a passed the test. The testing system 110 can provide this updated data object to one or more other devices, such as a robotic arm which can use the updated data object to determine that the electronic device 122a should be moved to the area 128.

Figure 2:
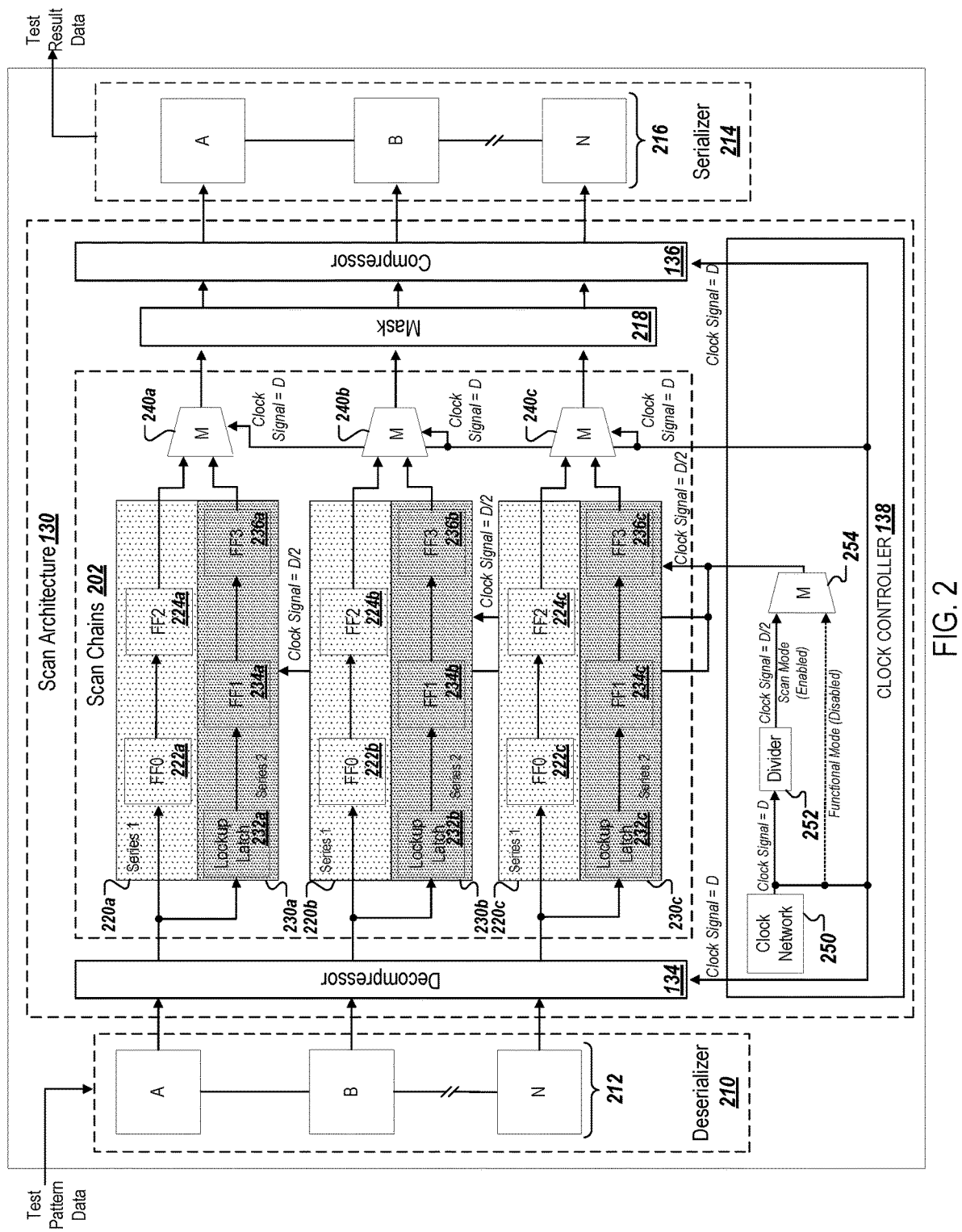
FIG. 2 is a diagram of an example high throughput scan architecture.

FIG. 2 is a diagram of the high throughput scan architecture 130. In addition to the decompressor 134, the compressor 136, and the clock controller 138 previously discussed, the scan architecture 130 can include a deserializer 210, a serializer 214, a mask 218, and multiple scan chains 202. As an example, the scan architecture 130 can be implemented on the electronic device 122a described in more detail above with respect to FIG. 1.

The deserializer 210 is connected to an input line of the deserializer 210. Through this input line, the deserializer 210 can receive test patterns provided by the testing system 110. The deserializer 210 includes an N number of serially loaded latches 212 (e.g., flip-flops). Using these serially loaded latches 212, the deserializer 210 can organize the incoming test pattern into N number of bit streams that are provided to the decompressor 134. Each bit stream may be eventually passed by the decompressor 134 to a particular scan chain of the scan chains 202 at a particular data rate.

The deserializer 210 can also control the mask 218. For example, the deserializer 210 can enable or disable the mask 218 using an additional latch that controls the mask 218. If this latch stores a bit having a value of 1, then the mask 218 can be enabled. However, if this latch stores a bit having a value of 0, then the mask 218 can be disabled.

The clock controller 138 is configured to provide different clock signals to different components of the scan architecture. The clock controller 138 can include a clock network 250 that provides a clock signal having a clock rate D. The clock controller 138 can also include a divider 252 that can divide the clock signal provided by the clock network 250. For example, the divider 252 can divide the clock signal by two to generate a second clock signal having a clock rate of D/2. The divider 252 can be a frequency divider.

Figure 6A:
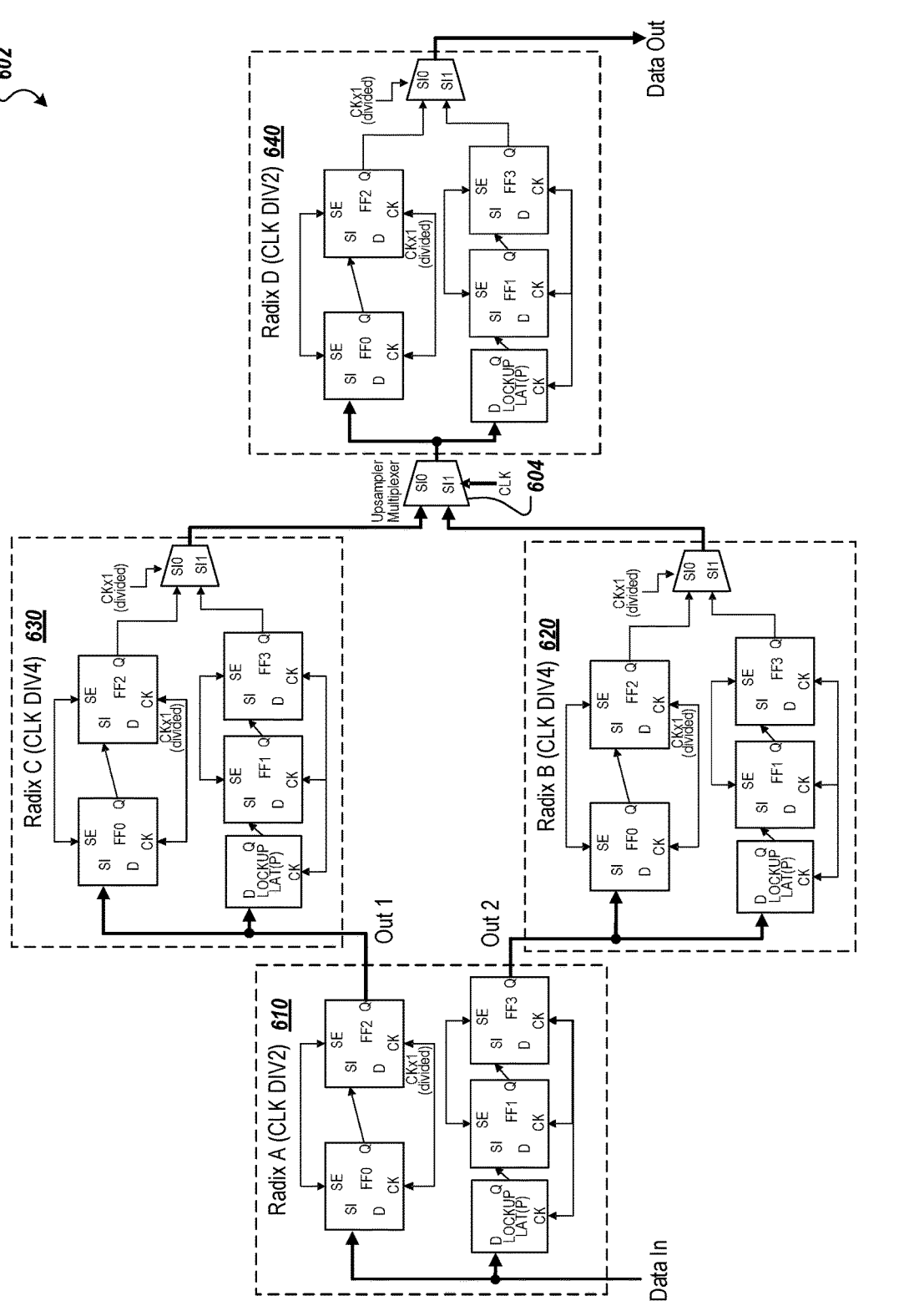
FIG. 6A-6B are diagrams of an example scan chain in a high throughput scan architecture and a timing diagram of the scan chain in use.

In some implementations, the divider 252 is a programmable frequency divider. For example, the divider 252 can be a programmable frequency divider that is configured to output a variable clock signal at a frequency that is dependent on a programmed state of the programmable frequency divider. The divided clock signal can, therefore, be a variable clock signal having a frequency that is based on the programmed state of the programmable frequency divider. As an example, the test system 110 can provide inputs that control the frequency divider to set the extent that the frequency of the undivided clock signal should be divided. In more detail, based on the electronic device 122a having a scan architecture where the scan chains each include two series of latches, the test system 110 can provide inputs that set the divider 252 to divide the frequency of the undivided clock signal by two. However, if the electronic device 122a instead has a scan architecture where the scan chains each include eight series of latches (e.g., as shown in FIG. 6A), then the test system 110 can provide different inputs that sets a first divider to divide the frequency by two and sets a second divider to divide the frequency by four.

The clock controller 138 can include a multiplexer 254 or other electronic switch to control which clock signal is provided to the latches of the scan chains 202. The clock signal that is provided, e.g., the undivided clock signal with clock rate D or the divided clock signal with clock rate D/2, depends on the current mode of the scan architecture 130. For example, when the scan architecture 130 is in shift mode (e.g., scan enabled state), the multiplexer 254 of the clock controller 138 is used to provide the divided clock signal with the clock rate D/2 to the latches of the scan chains 202. However, when the scan architecture 130 is in a functional mode (e.g., scan disabled state), the multiplexer 254 of the clock controller 138 is used to switch the output signal from the divided clock signal to the undivided clock signal with the clock rate D. That is, the multiplexer 254 can be used to act as a bypass of the divider 252 when the scan chains 202 are operating in a functional state.

In some implementations, the clock controller 138 uses multiple dividers or additional controls to provide multiple divided clock signals. For example, a scan architecture can include scan chains that each have eight series of latches. For each scan chain, four of the eight series can operate at a D/2 clock rate in shift mode and the remaining four series can operate at the D/4 clock rate. The clock controller 138 can use a first divider to generate a first divided clock signal having a rate of D/2 and a second divider to generate a second divided clock signal having a rate of D/4. To achieve this, the scan architecture can use multiple switching devices. For example, the scan architecture can include two multiplexers, a first multiplexer that receives and switches between the undivided clock signal from the clock network 250 and the first divided clock signal, and a second multiplexer that receives and switches between the undivided clock signal from the clock network 250 and the second divided clock signal.

The decompressor 134 can receive the undivided clock signal from the clock network 250 of the clock controller 138. The decompressor 134 can use the clock signal to provide the bit streams obtained or received from the deserializer 210 to the scan chains 202 at a particular data rate. The data rate may be equal to the clock rate D of the undivided clock signal. For example, in response to detecting a rising edge of the undivided clock signal, the decompressor 134 may read the values of all bits in the serially loaded latches 212 of the serializer 214 and provide these values as inputs to the scan chains. In more detail, if at the time the rising edge of the undivided clock signal is detected the bit value of Latch A of the serially loaded latches 212 is 0, then the decompressor 134 can obtain the 0 bit value and provide it to the first scan chain of the scan chains 202. The decompressor 134 may continue to obtain and provide the bit values as inputs to the scan chains 202 every clock cycle of the undivided clock signal.

The data rate provided by the decompressor 134 can be a division of the clock rate of the undivided clock signal. For example, the data rate may be a division of the clock rate D (e.g., D/2) where the operating rate of the latches of the scan chains 202 may be a further division of the clock rate (e.g., D/4).

In some implementations, the decompressor 134 and the compressor 136 receive a divided clock signal from the clock controller 138. Here, the clock controller 138 may provide a further divided clock signal to the latches of the scan chains 202. For example, the clock controller 138 may provide a clock signal having a clock rate of D/2 to the decompressor 134 and the compressor 136, and a second clock signal having a clock rate of D/4 to the latches of the scan chains 202.

The decompressor 134 can be a set of logical components that are used to reduce scan chain length. For example, the decompressor 134 can fan out the input bit streams received from the deserializer 210 over more scan chains than there are bit streams. Each of these scan chains can be shorter than the bit streams original call for. For example, if each bit stream is 16 bits in length but the internal scan chains 202 are limited to a bit-size of four, the decompressor 134 can be used to split the original bit stream into four bit streams of four bits each and proceed to provide each of the smaller bit streams to a different scan chain of the scan chains 202.

Each of the scan chains 202 can include a first series of latches 220 and a second series of latches 230. For example, a first scan chain includes a first series of latches 220a and a second series of latches 230a, a second scan chain includes a first series of latches 220b and a second series of latches 230b, and a third scan chain includes a first series of latches 220c and a second series of latches 230c.

Each series of latches in a scan chain can include an equal number of memory elements. These memory elements can include flip-flop latches, such as master-slave flip-flops as explained in more detail with respect to FIG. 5A. For example, in the 4-bit configuration shown, each of the scan chains 202 includes two flip-flop latches 222 and 224 in the first series of latches 220 and two flip-flop latches 234 and 236 in the second series of latches 230. Various other configurations are possible. For example, in an 8-bit configuration, each of the scan chains can include four flip-flop latches in the first series and four flip-flop latches in the second series. As another example, in a 16-bit configuration, each of the scan chains can include eight flip-flop latches in the first series and eight flip-flop latches.

The scan chains 202 can also include a component or a set of components that allows the different series of latches to store different bits by the decompressor 134. For example, each scan chain in the scan chain 202 can include a component or a set of components that prevents the first series of latches 220 and the second series of latches 230 from storing the same bits driven by the decompressor 134. As explained in more detail below with respect to FIGS. 5B-5D, this component or set of components can includes a memory component, such as a specialized flip-flop latch. However, other or additional components can be used. For example, each of the scan chains 202 can include a lockup latch 232 (e.g., a transparent latch) that prevents the first series of latches 220 and the second series of latches 230 from storing the same bits driven by the decompressor 134 by introducing a hold window in the second series of latches 230.

The lockup latch 232 can receive and operate at the divided clock signal and, therefore, introduce a hold window that is equal to or longer than a full cycle of the undivided clock signal used by the decompressor 134 and the compressor 136. For example, the lockup latch 232 can receive and operate at the divided clock signal that has a clock rate D/2 and, therefore, introduce a hold window that is a full cycle of the undivided clock signal used by the decompressor 134 and the compressor 136. The lockup latch 232 can be a positive lockup latch 232 (e.g., a positive level-sensitive lockup latch) that acts transparent when the divided clock signal is high and, therefore, provides a hold window when the divided clock signal is low.

In more detail, the decompressor 134 can drive bits into the scan chains 202 at a data rate equal to that of the clock rate D. When the decompressor 134 drives a first bit A in response to detecting a first positive edge of the undivided clock signal, the lockup latch 232 can capture the first bit A as it is triggered by the first positive edge of the divided clock signal that coincides with the first positive edge of the undivided clock signal. As will be explained in more detail below with respect to FIG. 5A and FIGS. 6A-6B, the first flip-flop 222a in the first series of latches 220a is prevented from capturing the first bit A because the flip-flop 222a can be a master-slave flip-flop where the master contains old data and the slave is not activated until a half-cycle of the divided clock signal has passed. That is, the flip-flop 222a must wait to move new data into the master until the old data can be moved into the slave when the divided clock signal goes low. For this same reason, the second flip-flop 234a is also prevented from capturing the first bit A when the divided clock signal is high and the lockup latch 232b is acting transparent. By the time a half-cycle of the divided clock signal has passed, e.g., when the divided clock signal goes low, a full cycle of the undivided clock signal has passed and the decompressor 134 starts driving a second bit B. With the divided clock low, the master and slave of the first flip-flop 222a are active and the flip-flop 222a can store the second bit B. However, because the lockup latch 232a introduced a hold window when the divided clock signal went low, the lockup latch 232a maintained the first bit A for the second latch 234a. Like the first flip-flop 222a, in response to the divided clock signal going low, the master and slave of the second flip-flop 234a are activated and the flip-flop 234a can store the output from the lockup latch 232a containing the bit A.

The ending of the hold window coincides with a third positive edge of the undivided clock signal which triggers the decompressor 134 to start driving a third bit C and the process described above repeating. For example, the lockup latch 232a can capture the third bit C. By the time the flip-flops of the first series 220a and the second series 230a are able to shift new data in (e.g., when master and slave elements in the flip-flops are both active), the decompressor 134 is driving a fourth bit D. After the divided clock signal goes low for the second time, first flip-flop 222a can release bit B which can be stored in the master of the third flip-flop 224a, the first flip-flop 222a can shift in the fourth bit D, the second flip-flop 234a can release bit A which can be stored in the fourth flip-flop 236a, and the second flip-flop 234a can shift in the third bit C due to the hold window provided by the lockup latch 232a. As this process continues, the first series of latches 220a and the second series of latches 230a can be fully loaded with different bits such that no latch in the first series of latches 220a stores the same bit as that in the second series of latches 230a.

After the memory elements of the scan chains 202 are loaded with values, the scan architecture 130 can be switched to a functional mode for testing the logic of the electronic device using the loaded values. For example, testing system 110 can provide an input to set the scan enable (SE) on each of the flip-flops in the scan chains 202 to 0 so as to disable shift mode. In functional mode, the values loaded into the memory elements of the scan chains 202 can be used to test the logical components of the electronic device.

Each scan chain can also include a multiplexer 240 or other switching component to generate a bit stream by combining the bits in the first series of latches 220 and the second series of latches 230. For example, after a circuit logic is tested in functional mode, the testing system 110 can place the scan architecture 130 back into shift mode by providing an input to set the scan enable (SE) on each of the flip-flops in the scan chains 202 to 1. The new values stored in the memory components of the scan chains 202, e.g., as a result of the logical testing in following a functional path, are then shifted out of the scan chains 202. A switching component such as the multiplexer 240 can then be used for each scan chain to combine the values released from the first series of latches 220 with those released from the second series of latches 230 to generate bit streams for each scan chain. Unlike other components of the scan chains 202 such as the latches of the scan chains 202, the switching components of the scan chains 202 can operate at the undivided clock signal in shift mode so as to generate bit streams that have a data rate that matches the clock rate D or the data rate of the bit streams previously driven by the decompressor 134.

As an example, the multiplexer 240a can receive and operate at the undivided clock signal to select between a value at the third flip-flop 224a and the fourth flip-flop 236a. Due to the multiplexer 240a operating at a frequency that is, in this example, twice that at which the flip-flops in the scan chain 202 are shifting bits, the multiplexer 240a can select and pass a first bit from the third flip-flop 224a and switch to select a bit from the fourth flip-flop 236a before a new bit has been shifted into the fourth flip-flop 236a. This operating speed difference between the bit shifting in the scan chains and the combining of bits by a switching component is important so as to prevent any bits from being lost, e.g., not included in the bit stream produced by the switching component.

The multiplexer 240*a* can continue to combine bits selected from the first series of latches 220*a* and those obtained from the second series of latches 230*a* until all captured bits (e.g., captured in the memory components of the first scan chain) are shifted out of the memory components.

The switching components of the scan chains 202 can provide the generated bit streams to a mask 218. The mask 218 may be enabled so as to mask the outputs of the scan chains 202 received from their corresponding switching components. Alternatively, the mask 218 may be disabled so that the outputs pass through the mask 218 to the compressor 136. For example, when enabled, the mask 218 can pass along the bit streams for each of the scan chains to the compressor 136 after masking those bit streams. Alternatively, when the mask 218 is disabled, the bit streams for each of the scan chains 202 can pass through the mask 218 directly to the compressor 136.

The compressor 136 can receive and operate at the undivided clock signal. The compressor 136 can be synchronized with the decompressor 134 such that the compressor 136 and the decompressor 134 both receive and operate at the same clock signal. The compressor 136 can receive the bit streams for the different scan chains 202, e.g., from the switching components of the scan chains 202 or the mask 218. The compressor 136 can proceed to provide the bits in the bit streams to a serializer 214.

The compressor 136 can be a set of logical components that are used to combine outputs from multiple scan chains to reduce the number of outputs. For example, the compressor 136 can include XOR gates that it uses to combine bit streams for different scan chains in the scan chains 202. For example, the compressor 136 can provide 4X compressor by combining the bit streams of every four scan chains so that the number of bit streams included in an output line of the serializer 214 is reduced by a factor of four to match design scan outputs. In more detail, there may be 16 scan chains in the scan chains 202 but only four serially unloaded latches in the serially unloaded latches 216 of the serializer 214. The compressor 136 can proceed to combine the bit streams of the first four scan chains in of the scan chains 202 and provide the combined bit stream to serially unloaded latch A of the serially unloaded latches 216, combine the bit streams of the next four scan chain and provide the second combined bit stream to serially unloaded latch B of the serially unloaded latches 216 the decompressor 134, and so on.

The serializer 214 is connected to the output line of the scan architecture 130. Through this output line, the serializer 214 can generate a test result data (e.g., a test output) for the electronic device being tested using the bit streams that it receives from the compressor 136. The serializer 214 includes an N number of serially unloaded latches 216 (e.g., flip-flops). Using these serially unloaded latches 216, the serializer 214 can organize the incoming bit streams into the test output.

Figures 3A, 3B:
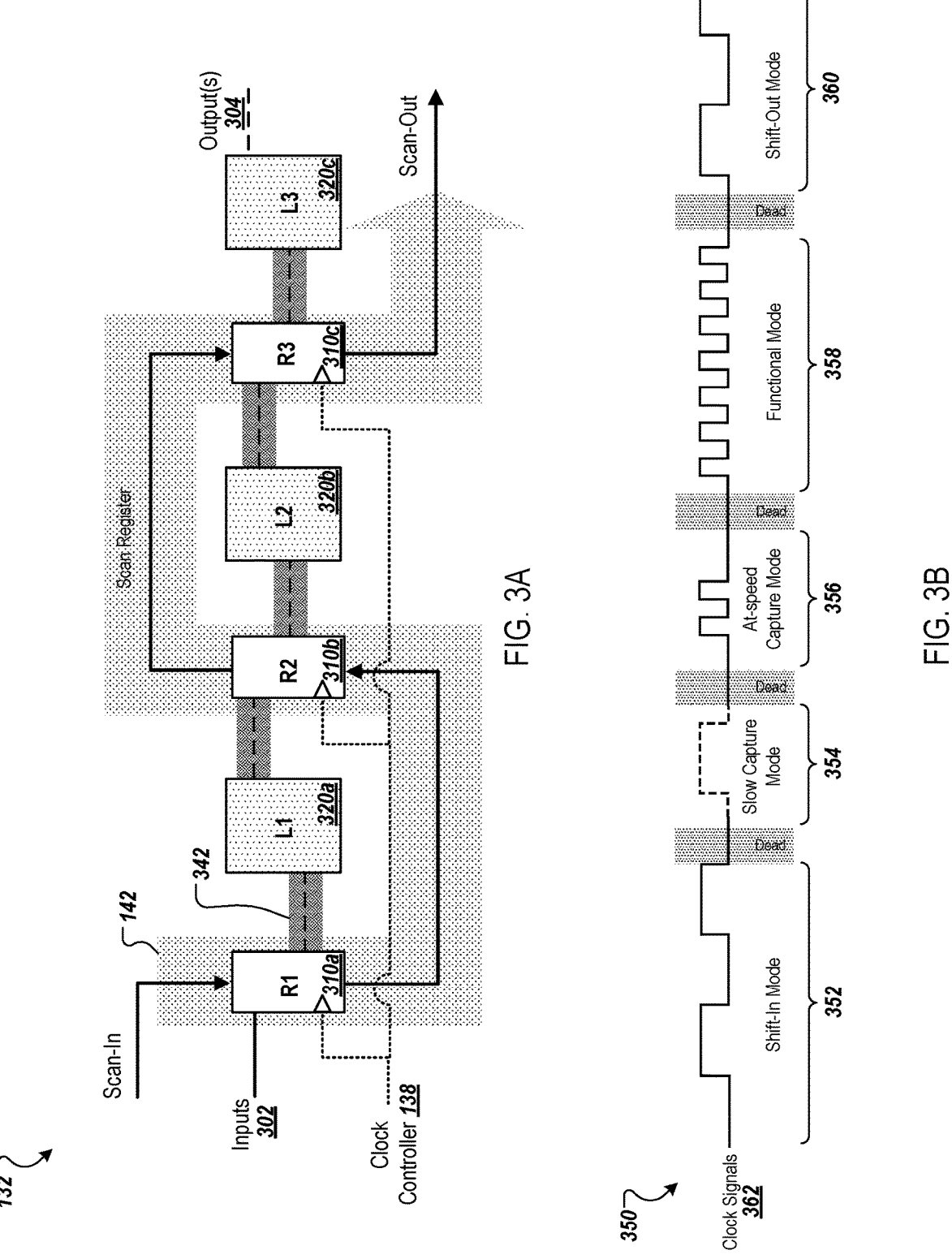
FIGS. 3A-3B are diagrams of an example scan chain of a high throughput scan architecture and a timing diagram for different modes of the scan chain.

FIGS. 3A-3B are diagrams of the scan chain 132 of a high throughput scan architecture and a timing diagram 350 for different modes of the scan chain 132.

As shown in FIG. 3A, the scan chain 132 can include a number of memory elements 310*a*, 310*b*, and 310*c*. Each of memory elements 310*a*, 310*b*, and 310*c* can be, for example, a register such as a shift register that includes one or more of flip-flops. The flip-flops can be triggered on the edge of a clock signal provided by the clock controller 138. The scan chain 132 can also include a number of logical components 320*a*, 320*b*, and 320*c*. The logical components 320*a*, 320*b*, and 320*c* can each represent a combinatorial logic block of the electronic device being tested or together can represent a combinatorial logic block of the electronic device being tested. Each of the logical components 320*a*, 320*b*, and 320*c* can include one or more logic gates connected through a set of nodes.

The scan chain 132 can operate in a test or shift mode (e.g., scan-in state) that follows the scan path 142 and a functional mode (e.g., capture state) that follows a functional path 343. At the start of a new test, the scan chain 132 can receive an input of the inputs 302 that switches the scan chain 132 into shift mode so that new values can be shifted into the memory components 310*a*, 310*b*, and 310*c*. For example, this input can set the scan enable (SE) for each of the memory components 310*a*, 310*b*, and 310*c* to high so as to disable functional mode. In other configurations of the scan chain 132, this input can set the scan enable (SE) for each of the memory components 310*a*, 310*b*, and 310*c* to low to disable functional mode. In shift mode, the memory components 310*a*, 310*b*, and 310*c* receive and operate at a divided clock signal from the clock controller 138. For example, in shift mode, the memory components 310*a*, 310*b*, and 310*c* receive a divided clock signal with a clock rate of D/2 where an undivided clock signal has a clock rate of D. In shift mode, the scan path 142 is followed as bit streams provided on the scan-in line are loaded into the memory components 310*a*, 310*b*, and 310*c*.

After the memory components 310*a*, 310*b*, and 310*c* are loaded with bits from the scan-in line, the scan chain 132 can receive a new input of the inputs 302 that switch the scan chain 132 from shift mode into functional mode. For example, this inputs can set the scan enable (SE) for each of the memory components 310*a*, 310*b*, and 310*c* to low so as to enable functional mode. In other configurations of the scan chain 132, this input can set the scan enable (SE) for each of the memory components 310*a*, 310*b*, and 310*c* to high to enable functional mode. In functional mode, the memory components 310*a*, 310*b*, and 310*c* can receive a different clock signal from the clock controller 138. For example, each of the memory components 310*a*, 310*b*, and 310*c* can receive and operate at the undivided clock signal with the clock rate D.

In functional mode, the bits loaded into the memory components 310*a*, 310*b*, and 310*c* follow the logical path 342. In following the logical path 342, the stored bits are released to the logical components 310*a*, 320*b*, and 320*c* and undergo logical operations. These logical operations can modify the bits by, for example, changing their values. After logical operations are performed on a bit, the bit can be stored in a memory component that immediately follows the one from which the bit was released or can provided as or as part of the output(s) 304. For example, as a result of the memory components 310*a*, 310*b*, and 310*c* being loaded with bits during shift mode, the first memory component 310*a* may store a third bit C with a value of 0, the second memory component may store a second bit B with a value of 0, and the third memory component may store a first bit A with a value of 1. In functional mode, the third bit C may be released by the first memory component 310*a* to the first logical component 320*a*, which performs a set of logical operations on the bit C. As a result of the logical operations, the bit C may be modified such that it now has a value of 1. Bit C can then be stored in the second memory component 310*b*. At substantially the same time that the first bit C is released, the second bit B may be released by the second memory component 310*b* to the second logical component 320*b*, which also performs a set of logical operations on the bit B. Despite undergoing the logical operations, the bit B may retain its original value of 0. Bit B can then be stored in the third memory component 310c. At substantially the same time that the third bit C and the second bit B are released, the first bit A can be released by the third memory component 310c to the third logical component 320c, which also performs a set of logical operations on the bit A. As a result of the logical operations, the bit A may be modified such that it now has a value of 0. Bit A can be outputted as or as a portion of the output(s) 304.

After the logical operations are performed and the resulting values are stored in memory components of the scan chain 132 or provided in the output(s) 304, a final step of shifting the bits out of the memory components is performed. For example, to end the test, the scan chain 132 can receive a final input of the inputs 302 that switches the scan chain 132 back into shift mode so that the stored bits can be shifted out onto the scan-out line. For example, this inputs can set the scan enable (SE) for each of the memory components 310a, 310b, and 310c to high so as to disable functional mode and enable shift mode. In this shift mode, the memory components 310a, 310b, and 310c can again receive and operate at a divided clock signal provided by the clock controller 138. As an example, at this divided clock signal and during a first cycle, the modified bit B stored in the third memory component 310c can be released onto the scan-out line and the modified bit C stored in the second memory component 310b can be released and shifted into the third memory component 310c. During a second cycle, the modified bit C now stored in the third memory component 310c can be released onto the scan-out line, completing the shift-out operation.

The test results can include the values read from the scan-out line and the outputs 304. For example, the test system 110 can generate a vector using the output(s) 304 and the values read on the scan-out line. In more detail, the test system 110 may generate a vector that initially contains only the value of the modified bit A in the outputs 304. This value may be available to the test system 110 before shift mode is entered for the second time. In the first cycle of shift mode during shift-out, the test system 110 may read the value of the modified bit B on the scan-out line and add this value to the vector. In a second cycle of shift mode during shift-out, the test system 110 can read the value of the modified bit A on the scan-out line and add this value to the vector. The resulting vector can be represented as [bit A; bit B; bit C] or [0; 0; 1]. This vector can represent the test output or a portion of the test output, e.g., a bit stream, for the scan chain 132.

FIG. 3B shows a variety of different operation modes 350 that an electronic device can be placed in. These operation modes 350 include a shift-in mode 352, a slow capture mode 354, an at-speed capture mode 356, a functional mode 358, and a shift-out mode 360. Many of these operations modes are for scan chain testing, such as the shift-in mode 352, the slow capture mode 354, the at-speed capture mode 356, and the shift-out mode 360. In contrast, the functional mode 358 is used for the normal operation of the device.

As shown, the different modes 350 may use different clock signals 362. These clock signals 362 can be generated by the clock controller 138. The clock controller 138 can control which of the clock signals of the clock signals 362 is provided to components of the electronic device for the different modes 350. For example, the clock signals 362 can represent the clock signals that are provided to the latches of the electronic device by the clock controller 138 for different modes of the electronic device. In more detail, with respect to FIG. 2, the clock controller 138 can provide a divided clock signal for the shift-in mode 352 to the latches in the scan architecture 130 of the electronic device when the electronic device is placed in shift mode. However, in response to shift mode being disabled and functional mode being enabled, the clock controller 138 can provide the latches with an undivided, higher frequency clock signal for capture mode.

A higher-frequency clock signal can be used by the latches in the functional mode 358 (e.g., when the frequency of the higher-frequency clock signal is higher than the frequency of the clock signal used by the latches in shift mode) and in the at-speed capture mode 356 (e.g., when the frequency of the higher-frequency clock signal is higher than the frequency of the clock signal used by the latches in the slow capture mode 354). In these modes, the higher-frequency clock signal can be provided by the clock controller 138 to the latches of the electronic device. The frequency of the clock signal provided to the latches, can be the same in the functional mode 358 and in the at-speed capture mode 356. As an example, the high-frequency clock signal can be the undivided clock signal generated by the clock network 250.

In contrast, a lower-frequency clock signal can be used by the latches in shift mode (e.g., shift-in mode 352 and shift-out mode 360 when the frequency of the lower-frequency clock signal is lower than the frequency of the clock signal used by the latches in the functional mode 358) and the slow capture mode 354 (e.g., when the frequency of the lower-frequency clock signal is lower than the frequency of the clock signal used by the latches in the at-speed capture mode 356). In these modes, the lower-frequency clock signal can be provided by the clock controller 138 to the latches of the electronic device. The frequency of the clock signal provided to the latches, can be the same in shift mode and in the slow capture mode 354. For example, as shown, the frequency of the clock signal shift-in mode 352, the slow capture mode 354, and the shift-out mode 360 can each be the same with a frequency that is one-fourth of the frequency of the clock signal used by the latches in the functional model 358.

When the electronic device is operating in functional mode 358, the electronic device is operating normally and no scan chain testing is occurring. However, functional mode pulses are used during scan chain testing to test the logic elements of the scan architecture 130. These pulses are provided during capture mode described in more detail below.

When the electronic device is placed in the shift-in mode to start scan chain testing, values are loaded into the latches of the scan architecture 130 that operate at a clock signal having a frequency that is a division of that used by the latches in the functional mode 358.

After the values for scan chain testing are loaded into the latches, the electronic device can be placed in a capture mode. For example, the electronic device can be placed in the slow capture mode 354 or the at-speed capture mode 356. In capture mode, the latches of the electronic device are switched (e.g., scan enable is disabled) so that the data stored in the latches follows the data path 342 shown in FIG. 3A. Effectively, the latches are placed in the functional mode 358 for a limited number of clock cycles so that the data in the latches can be passed through the logic elements 320a, 320b, and 320c. For example, the testing system 110 may switch the latches back to shift mode after a single pulse of one or two clock cycles.

In some implementation, the electronic device is configured to use only one capture mode. For example, the clock controller 138 can be configured to only provide the latches the undivided clock signal when shift mode is disabled to achieve the at-speed capture mode 356. In other implementations, the electronic device is configured to use both capture modes. For example, the clock controller 138 can be configured to continue to provide a divided clock signal to the latches after the electronic device is placed in slow capture mode, but be configured to provide an undivided clock signal to the latches if the electronic device is instead placed in at-speed capture mode.

The capture mode used can depend on the type of test being performed by the testing system 110 or to identify causes of errors or defects. For example, if the testing system 110 determines to test the electronic device 122a for defects that are not frequency or temperature dependent, the test pattern used by the testing system 110 may provide for placing the electronic device 122a into the slow capture mode 354 after the latches are loaded with values during the shift-in mode 352. Due to the slower clock speed of the clock signal used during slow capture mode 354, there is a reduced chance of observed errors being caused by frequency of the clock network 250 or from heat (e.g., since less heat will be generated when components of the electronic device 122a operate at the slower clock speed).

In some implementations, both captures modes are used. For example, during a test of the device 122a, the testing system 110 can provide a testing pattern to load the scan chains of the device 122a with first sets of values during the shift-in mode 352. The testing system 110 can then provide a signal to switch the device 122a to the slow capture mode 354 before shifting the values out of the scan chains during the shift-out mode 360. If these initial results show that the device 122a failed the test despite the slow capture mode 354 being used the testing system 110 may (i) not bother to continue the test (e.g., to test the device 122a using the at-speed capture mode 356) and/or (ii) determine that the device 122a included a defect that was dependent on frequency or hear. However, if the initial results of the test show that the device 122a performed as expected, the testing system 110 may proceed to place the device 122a into at-speed capture mode 356 (e.g., latches may have already been loaded with new values during the previous shift-out mode 360) before again placing the device 122a into the shift-out mode 360. If the new output now indicates that the device 122a did not perform as expected, the testing system 110 may determine that defect or error is temperature or frequency related.

Figure 4:
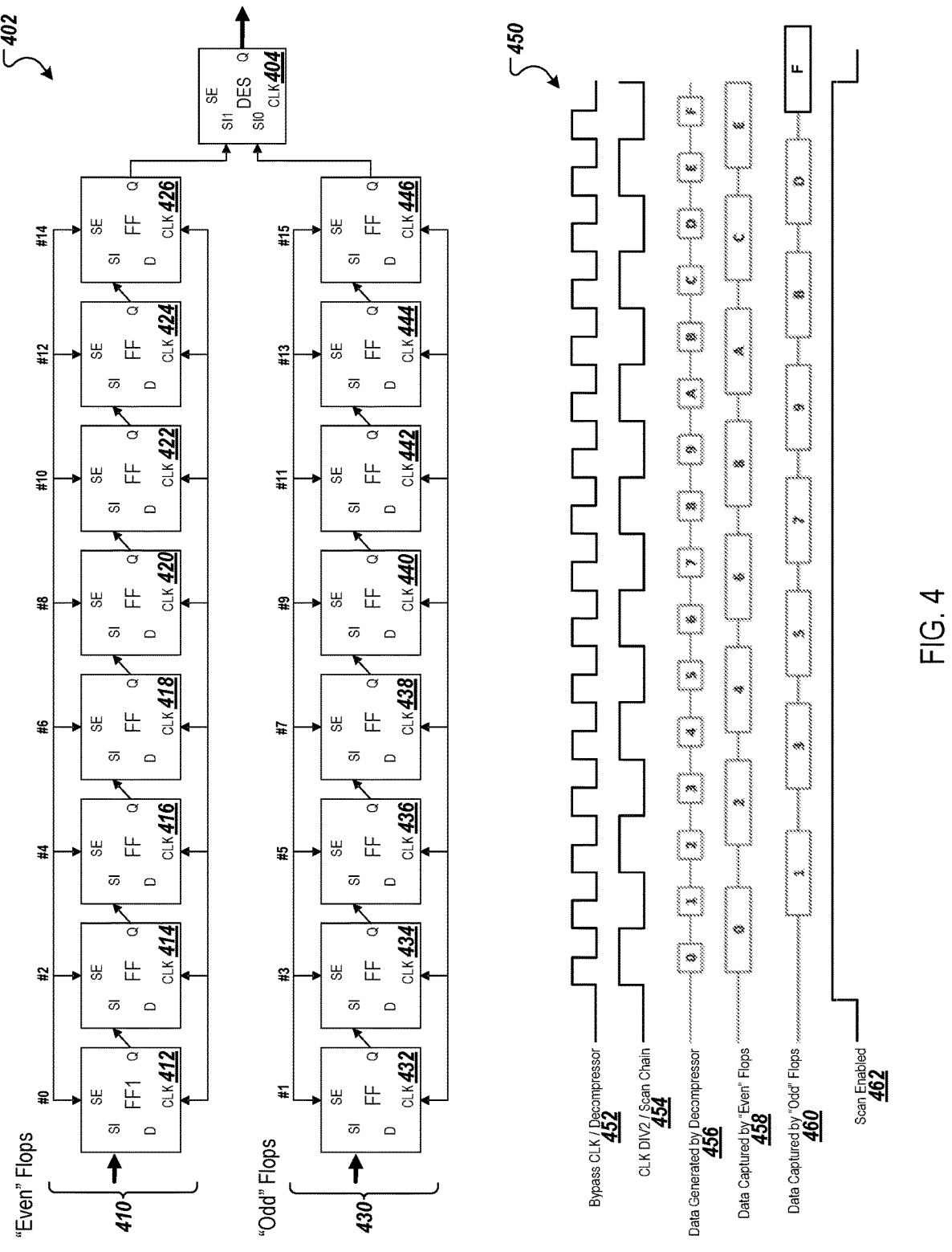
FIG. 4 is diagram of an example scan chain in a high throughput scan architecture and a timing diagram of the scan chain in use.

FIG. 4 is diagram of an example scan chain 402 in a high throughput scan architecture and a timing diagram 450 of the scan chain 402 in use. The scan chain 402 includes a first series of memory components 410 and a second series of memory components 430. The memory components in the first series 410 and in the second series 430 can receive a divided clock signal 454 and operate in shift mode at the divided clock signal 454. The memory components can include flip-flops, such as a master-slave flip-flops. The scan chain 402 can also include a dual edge sampling (DES) element 404 to combine the outputs of the first series 410 and the second series 430. The DES 404 can receive multiple clock signals. For example, a latch component of the DES 404 can receive and operate at the divided clock signal 454 while a switching component of the DES 404 can receive and operate at an undivided clock signal 452. The divided clock signal 454 may have a frequency that is one half (or a further division) of the frequency of the undivided clock signal 452. Specifically, the frequency of the divided clock signal 454 can be represented by the following equation:

$$f_{CLKdivided} = \frac{f_{CLKundivided}}{2^n}$$

In this equation, n can be any integer greater than 0.

The scan chain 402 is shown having a 16 bit-size. However, various other configurations are possible. For example, the scan chain 402 can alternatively have an 8-bit configuration where the first series 410 includes four flip-flops and the series 430 includes four additional flip-flops.

The first series 410 includes multiple memory elements. For example, the first series 410 can include eight flip-flops 412, 414, 416, 418, 420, 422, 424, and 426. Of these memory elements, the first series 410 can include a specialized memory element that prevents the first series 410 and the second series 410 from storing the same bits driven by the decompressor 134. For example, the first series 410 can include a specialized flip-flop 412 that differs from the other flip-flops 414, 416, 418, 420, 422, 424, and 426. Unlike the other flip-flops, the specialized flip-flop 412 can be designed to allow the immediate storage of any bits driven by the decompressor 134. For example, the specialized flip-flop 412 may allow the master component to be bypassed during shift mode such that values can be immediately shifted into the slave component without requiring a half-cycle delay of the divided clock signal 454 unlike the other flip-flops. Accordingly, the specialized flip-flop 412 can introduce a half-cycle advance in bit shifting when compared to the shifting that takes place in the second series 430.

The second series 430 also includes multiple memory elements. For example, the second series 430 can include eight flip-flops 432, 434, 436, 438, 440, 442, 444, and 446. Unlike the first series 410, each of the memory elements in the second series may be the same type or design. For example, the flip-flops 432, 434, 436, 438, 440, 442, 444, and 446 may all share the same master-slave design described in more detail below with respect to FIG. 5A.

The first series 410 and the second series 430 can be loaded with values driven by a decompressor to start a test of an electronic device. For example, the decompressor 134 can provide data 456 generated by the decompressor 134 to the scan chain 402 at the rate of the undivided clock signal 452. As explained above, the specialized flip-flop 412 of the first series 410 can store the bit 0 as shown in the data 458 captured by the even flops in the first series 410. The first flip-flop 432 in the second series 430 may be prevented from capturing the first bit 0 due to old data being stored in the master component of the flip-flop 432 and the slave component of the flip-flop 432 not being enabled until the divided clock signal 454 goes low. However, when the divided clock signal 454 goes low, the master and slave components of the flip-flop 432 are activated and the flip-flop 432 can store the current bit in the data 456 being driven by the decompressor 134. As shown in the data 456, the bit driven by the decompressor 134 when the divided clock signal 454 goes from high to low is bit 1 and, as shown in the data 460, the flip-flop 432 captures the bit 1.

As this process continues, the first series 410 will be loaded with half of the bits in the data 456 and the second series 430 will be loaded with the other half of the bits in the data 456. For example, once loading is complete, the first series 410 will be loaded with the data 458 and the second series 430 will be loaded with the data 460. In more detail, when loading is complete, the flip-flop 426 will store bit 0, the flip-flop 424 will store the bit 2, the flip-flop 422 will store the bit 4, the flip-flop 420 will store the bity 6, the flip-flop 418 will store the bit 8, the flip-flop 416 will store the bit A, the flip-flop 414 will store the bit C, and the flip-flop 412 will store the bit E. In the second series 430, the flip-flop 446 will store bit 1, the flip-flop 444 will store the bit 3, the flip-flop 442 will store the bit 5, the flip-flop 440 will store the bity 7, the flip-flop 438 will store the bit 9, the flip-flop 436 will store the bit B, the flip-flop 434 will store the bit D, and the flip-flop 432 will store the bit F. After loading is complete, the scan chain 402 can be placed in a functional mode so that logical operations are performed using the stored bits.

In shift mode, the memory components in the first series 410 and the second series 430 store bits for a time equivalent to one full divided clock cycle or two undivided clock cycles before release them due to shifting taking place at the rate of the divided clock signal 454. This prevents the first series 410 and the second series 430 from capturing every bit in the data 456. In more detail, because the decompressor 134 is providing the data 456 at the rate D of the undivided clock signal 452 and the first series 410 is sampling the data 456 at rate D/2, the first series 410 is limited to capturing only every other value in the data 456. For this same reason, the second series 430 is also limited to capturing only ever other value in the data 456. Due to the timing difference in sampling between the first series 410 and the second series 430 that is equivalent to a half-cycle of the divided clock signal 454 and a full-cycle of the undivided clock signal 452, ever bit in the data 456 is captured because the bits that the first series 410 is prevented from capturing are captured by the second series 430 and the bits that the second series 430 is prevented from capturing are captured by the first series. As a result, the first series 410 and the second series 430 never capture the same bit driven by the decompressor 134.

The DES 404 can combine the outputs of the first series 410 and the outputs of the second series 430 at a clock rate of the undivided clock signal 452 when shift mode is enabled to end a test of an electronic device. For example, in response to scan-enable 462 going high, values stored in the first series 410 and the series 430 start to shift out values at the rate D/2 of the divided clock signal 454. The DES 404 can proceed to combine the outputs of the first series 410 and the outputs of the second series 430 at a clock rate D that is twice the rate of the divided clock signal 454 that the flips-flops 412, 414, 416, 418, 420, 422, 424, 426, 432, 434, 436, 438, 440, 442, 444, and 446 operate at in shift mode. By doing this, the DES 404 can generate a bit stream for the scan chain 402 that has a data rate of D when shifting values out of the scan chain in shift mode.

The DES 404 can operate at the undivided clock signal 452 to switch between selecting outputs from the first series 410 and outputs from the second series 430. For example, when the undivided clock signal 452 is high, the DES 404 can select to provide the output of the flip-flop 426 in the first series 410. When the undivided clock signal 452 goes low, the DES 404 can switch so as to select the output of the flip-flop 446 in the second series 430. By doing this, the DES 404 can interleave the outputs of the first series 410 with the outputs of the second series 430. This effectively places the bits back in their original order, though the values of the bits may have been modified during logical operations performed on them when the scan chain 402 was placed in a functional mode for device testing.

The DES 404 can be designed to account for the timing difference between the first series 410 and the second series 430. As explained above, this timing difference can appear as a half-cycle delay of the divided clock signal 454 in the second series 430 compared to the first series 410. This timing difference is shown in the timing diagram 450 through the comparison of the data captured by the even flops 458 in the first series 410 and the data captured by the odd flops 460 in the second series 430. The DES 404 can account for the timing difference by introducing a half-cycle delay of the divided clock signal 454 in the first series 410. For example, the DES 404 can include a lockup latch component, such as a positive level-sensitive lockup latch, that introduces a half-cycle hold window in the first series 410.

In some implementations, the scan chain 402 does not include the DES 404. For example, the scan chain 402 can include a multiplexer to combine the outputs of the first series 410 and the second series 430 and avoid the need for the DES 404 by introducing a redundant half-cycle in the scan shift.

FIGS. 5A-5D are diagrams of different latches that can be used in a scan chain of a high throughput scan architecture.

FIG. 5A shows a diagram of a flip-flop latch 502 that can be used in the scan architecture 130. For example, the flip-flops 414-426 and the flip-flops 432-446 shown in FIG. 4 can share the design of the flip-flop 502. The flip-flop 502 can be a master-slave flip-flop that includes a master component 506 and a slave component 508. The master component 506 can itself be or include a flip-flop. For example, the master component 506 can be a positive level-sensitive lockup latch that introduces a half-cycle hold window when the divided clock signal goes low. The slave component 508 can itself be or include a flip-flop. For example, the slave component 508 can be a negative level-sensitive lockup latch that introduces a half-cycle hold window when the divided clock signal goes high.

The flip-flop 502 also includes a switching component 504. The switching component 504 can be a multiplexer that switches between a functional path (data) in functional mode and a scan path (scan) in shift mode. Switching of the switching component 504 can be controlled by input at the scan enable (SE) node. For example, when SE is set to high, the switching component 504 can select the scan path. However, when SE is set to low, the switching component 504 can select the functional path.

The flip-flop latch 502 can operate at a divided clock signal that has a clock rate that is a division of that used by the decompressor 134 and the compressor 136 in the scan architecture 130. In operation, the master component 506 can be activated to capture new values when the divided clock signal goes high and stay active until the clock goes high again. The master component 506 can then remain inactive until the clock goes high a third time and the process repeats. The slave component 508 can be activated to capture data from the master component 506 when the divided clock signal goes low and stay active until the clock goes low again. The slave component 508 can then remain inactive until the clock goes low a third time and the process repeats. Accordingly, there is always a half-cycle delay (e.g., half-cycle of the divided clock signal) between when the master component 506 is active and the slave component 508 is active. Therefore, shifting old values out of the flip-flop latch 502 in order to shift new values into the flip-flop latch 502 takes a half-cycle of the divided clock signal or a full-cycle of the divided clock signal.

FIG. 5B shows a diagram of a specialized flip-flop latch 510 that can be used in the scan architecture 130 at the input stage of a scan chain. For example, the flip-flop 412 shown in FIG. 4 can use the design of the flip-flop 510. The flip-flop 510 can be a master-slave flip-flop that includes a master component 514 and a slave component 516. The master component 514 can itself be or include a flip-flop. For example, the master component 514 can be a positive level-sensitive lockup latch. However, when the scan architecture 130 is placed in shift mode, the master component 514 is bypassed. The slave component 516 can itself be or include a flip-flop. For example, the slave component 516 can be a negative level-sensitive lockup latch that introduces a half-cycle hold window when the divided clock signal goes high.

The flip-flop 510 also includes a switching component 512. The switching component 512 can be a multiplexer that switches between a functional path (data) in functional mode and a scan path (scan) in shift mode. Switching of the switching component 512 can be controlled by input at the scan enable (SE) node. For example, when SE is set to high, the switching component 512 can select the scan path. However, when SE is set to low, the switching component 512 can select the functional path.

The flip-flop latch 510 can operate at a divided clock signal that has a clock rate that is a division of that used by the decompressor 134 and the compressor 136 in the scan architecture 130. During shift mode operation, the master component 514 is bypassed. This allows values to be passed from the switching component 512 directly to the slave component 516. Therefore, shifting new values into the flip-flop latch 510 during shift mode requires substantially no delay.

FIG. 5C shows a diagram of a specialized flip-flop latch 520 that can be used in the scan architecture 130. The flip-flop 520 can be used at the input stage of a scan chain. For example, the flip-flop 412 shown in FIG. 4 can use the design of the flip-flop 520. Alternatively, the flip-flop 520 can be used in a scan chain where each flip-flop in the scan chain is the flip-flop 520 or shares the design of the flip-flop 520. The flip-flop 520 can be a master-slave flip-flop that includes a master component 524 and a slave component 526. The master component 526 can itself be or include a flip-flop. For example, the master component 524 can be a positive level-sensitive lockup latch that introduces a half-cycle hold window when the divided clock signal goes low. However, when the scan architecture 130 is placed in shift mode, the master component 514 can be bypassed. The slave component 516 can itself be or include a flip-flop. For example, the slave component 516 can be a negative level-sensitive lockup latch that introduces a half-cycle hold window when the divided clock signal goes high.

The flip-flop 502 also includes two switching components 522a and 522a. The first switching component 522a can be a multiplexer that switches between a functional path (data) in functional mode and a scan path (scan) in shift mode. Switching of the switching component 522a can be controlled by input at the scan enable (SE) node. For example, when SE is set to high, the switching component 522a can select the scan path. However, when SE is set to low, the switching component 522a can select the functional path.

The second switching component 522b can be a multiplexer that switches between the scan path (scan) and the output of the master component 524. Switching of the switching component 522b can be controlled by input at the scan enable (SE) node. For example, when SE is set to high, the switching component 522b can select the scan path. However, when SE is set to low, the switching component 522b can select the output of the master component 524.

The flip-flop latch 520 can operate at a divided clock signal that has a clock rate that is a division of that used by the decompressor 134 and the compressor 136 in the scan architecture 130. During shift mode operation, the master component 514 is bypassed. However, unlike the flip-flop latch 510, the master component 524 of the flip-flop 520 is loaded with a value from the scan path in shift mode. The bypass of the master component 524 allows values to be passed from the switching component 522b directly to the slave component 516. For example, in shift mode operation, a bit A driven on the scan path is provided to the master component 524 through the switching component 522a and stored by the master component 523. The same bit A is also provided to the slave component 526 through the switching component 522b and stored by the slave component 526. Therefore, shifting new values into the flip-flop latch 520 during shift mode requires substantially no delay.

FIG. 5D shows a diagram of a dual edge sampling (DES) element 530 that can be used in the scan architecture 130. For example, the DES 404 in FIG. 4 can share the design of the DES 530. The DES 530 can receive and use multiple clock signals, including a divided clock signal and an undivided clock signal. The DES can include a latch 534 ("S") that is operated using the divided clock signal and a switching component 532 that is operated using the undivided clock signal. The switching component 532 can be a multiplexer that switches between a first signal-in line ("SI1") and a second signal-in line ("SI2").

The DES 530 can be used to combine outputs that appear on the first signal-in line ("SI1") and values that appear on the second signal-in line ("SI2") to generate an output. For example, when incorporated into a scan architecture and during shift mode operation, the DES 530 can use the switching component 532 to switch between sampling outputs on the first signal-in line and outputs on the second signal-in line to generate an output on a scan-out line of a scan chain. The latch 534 can introduce a delay to the first signal-in line to, for example, account for timing differences between the first signal-in line and the second signal-in line. The latch 534 can be a lockup latch, such as a positive level-sensitive lockup latch, that introduces a half-cycle hold window in the first signal-in line. As an example, this hold window can help to align the timing of values shifting through the first series of latches 410 and the second series of latches 430 shown in FIG. 4 to account for the timing offset introduced by a specialized flip-flip in the first series of latches 410, such as the flip-flop 510 or the flip-flop 520.

The switching component 532 can operate at a higher frequency than the frequency that new values appear on the signal-in lines. For example, new outputs can appear on the first signal-in line and the second signal-in line a rate of D/2. However, the switching component 532 can switch between the two lines at a rate of D. This allows the DES 530 to sample the outputs on both lines while switching without risking missing any outputs. Additionally, any possibility of missing an output due to timing differences between the two lines is removed through the use of the latch 534. For example, the latch 534 can introduce a hold window to account for timing differences and give the switching component 532 additional time to sample the first signal-in line.

Figure 6B:
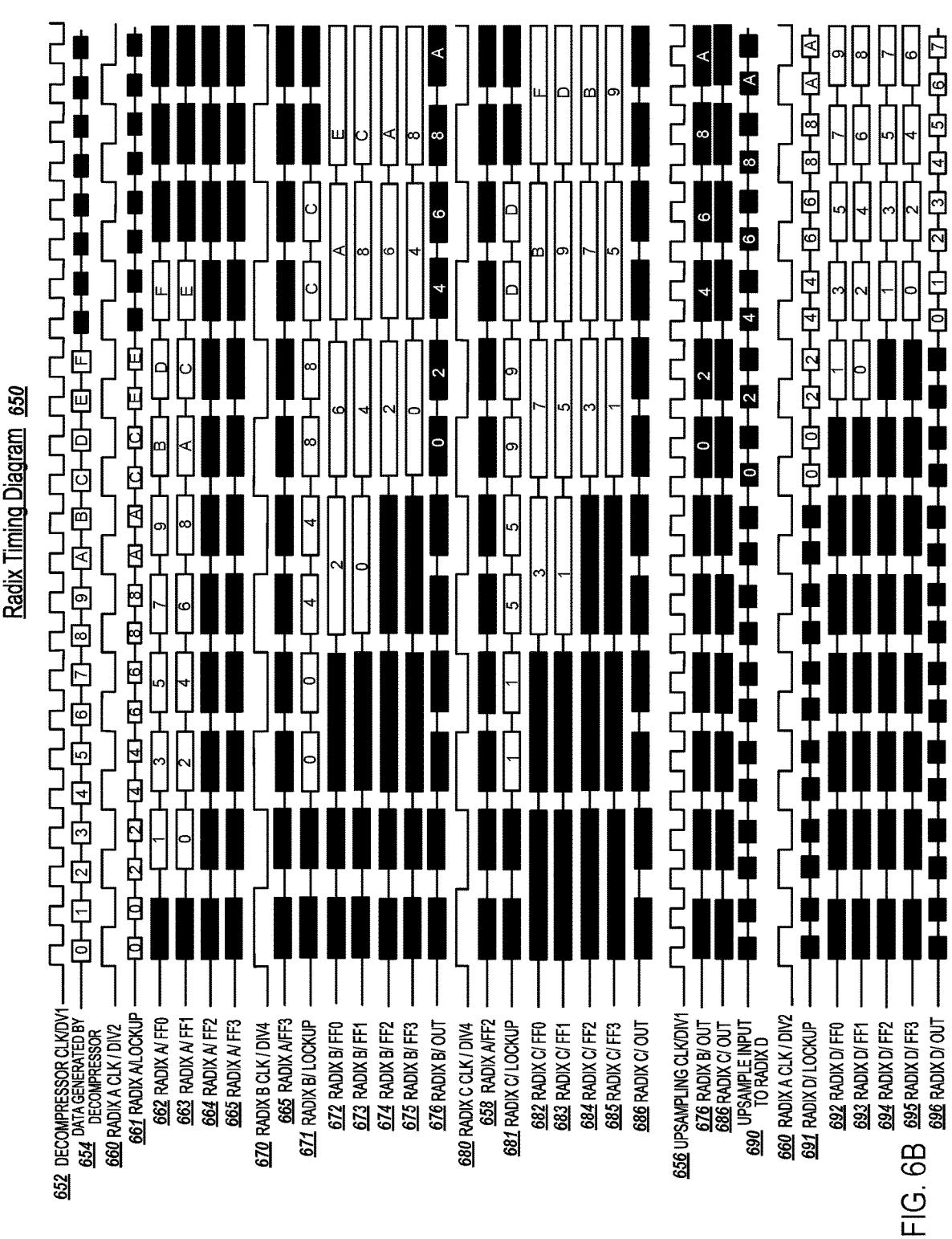

FIG. 6A-6B are diagrams of an example scan chain 602 in a high throughput scan architecture and a timing diagram 650 of the scan chain in use.

As shown in FIG. 6A and with reference to the timing diagram of FIG. 6B, the scan chain 602 includes eight different series of latches organized into four elements 610, 620, 630, and 640. Two of these elements, the element 610 (Radix A) and the element 640 (Radix D) operate a first divided clock signal 660. The remaining two elements, element 620 (Radix B) and the element 630 (Radix C) operate at a second divided clock signal 670 (also referred to as clock signal 680) that is a further division of an undivided clock signal. For example, the first divided clock 660 signal can have a clock rate of D/2 that is one half of the undivided clock signal 652 and upsampling clock signal's rate of D. The second divided clock signal 670 can have a clock rate of D/4 that is one fourth of the undivided clock signal 652's rate of D. The scan chain 602 is shown having a bit-size of 16 with each of the elements 610, 620, 630, and 640 containing four memory components. However, various other configurations are possible. For example, the scan chain 602 could have a bit-size of 32 with each of the elements 610, 620, 630, and 640 containing eight memory components.

Each of the elements 610, 620, 630, and 640 includes multiple memory components and a lockup latch. The memory components can be latches, such as master-slave flip-flops. The lockup latches can be, for example, positive level-sensitive lockup latches that act transparent when their respective divided clock signal is high and, therefore, provide a hold window when their respective divided clock signal is low. Each of the elements 610, 620, 630, and 640 also include a first series of memory components and a second series of memory components. Individually, each of the elements 610, 620, 630, and 640 operates similarly to the scan chains 202 described in more detail above with respect to FIG. 2.

From the data 654 provided by the decompressor 134, the first series of memory components in the first element 610 can capture the positionally odd bits of data. For example, see the data 662 captured by FF0 of the first element 610 and the data 664 captured by FF2 of the first element 610. Accordingly, the first output of the first element 610 can include a bit stream with the following bits: 1, 3, 5, 7, 9, B, D, and F. However, during shift-in, the bit D may stop shifting once it is loaded into the memory component FF2 of the first element 610. Similarly, during shift-in, the bit F may stop shifting once it is loaded into the memory component FF0 of the first element 610.

From the data 654 provided by the decompressor 134, the second series of memory components in the first element 610 can capture the positionally even bits of data. For example, see the data 661 captured by the lockup latch of the first element 610, the data 663 captured by FF1 of the first element 610, and the data 665 captured by FF3 of the first element 610. Accordingly, the second output of the first element 610 can include a bit stream with the following bits: 0, 2, 4, 6, 8, A, C, and E. However, during shift-in, the bit C may stop shifting once it is loaded into the memory component FF3 of the first element 610. Similarly, during shift-in, the bit E may stop shifting once it is loaded into the memory component FF1 of the first element 610.

The first output of the first element 610 represented as the data 664 is fed as input data to the signal-in line of the third element 630 that is running at a further downsampled frequency (e.g., a frequency that is one half of the frequency that the first element 610 is running at). The second output of the first element 610 represented as the data 665 is fed as input data to the signal-in line of the second element 620 that is running at a further downsampled frequency (e.g., a frequency that is one half of the frequency that the first element 610 is running at). Shifting between memory component within the second element 620 and the third element 630 is based on the second divided clock signal. Therefore, shifts between memory components in the second element 620 and the third element 630 take place every four cycles of the undivided clock signal. However, because the elements 620 and 630 each use two series of latches, no delay or substantially no delay in shifting is introduced by the slower shifting occurring in the elements 620 and 630.

From the data 665 provided by the first element 610 to input line of the second element 620, the first series of memory components in the second element 620 can capture the positionally odd bits of data. For example, see the data 672 captured by FF0 of the second element 620 and the data 674 captured by FF2 of the second element 620. Accordingly, the output of the first series of the second element 620 can include a bit stream with the following bits: 2, 6, A, and E.

From the data 665 provided by the first element 610 to the input line of the second element 620, the second series of memory components in the second element 620 can capture the positionally even bits of data. For example, see the data 671 captured by the lockup latch of the second element 620, the data 673 captured by FF1 of the second element 620, and the data 675 captured by FF3 of the second element 620. Accordingly, the output of the second series of the second element 620 can include a bit stream with the following bits: 0, 4, 8, and C.

The second element 620 can include a switching component, such as a multiplexer, that combines the outputs of the first series of memory components of the second element 620 with the outputs of the second series of memory components of the second element 620. The switching component can operate at a higher frequency than the memory components of the second element 620. For example, the switching component of the second element 620 can operate at the first divided clock signal 660 that has a rate of D/2, instead of the second divided clock signal 670 that has a rate of D/4. The output of the switching component is represented as data 676. This output is provided to a first signal-in line (SI0) of the upsampler multiplexer 604.

From the data 664 provided by the first element 610 to the input line of the third element 630, the first series of memory components in the third element 630 can capture the positionally odd bits of data. For example, see the data 682 captured by FF0 of the third element 630 and the data 684 captured by FF2 of the third element 630. Accordingly, the output of the first series of the third element 630 can include a bit stream with the following bits: 3, 7, B, and F.

From the data 664 provided by the first element 610 to input line of the third element 630, the second series of memory components in the third element 630 can capture the positionally even bits of data. For example, see the data 681 captured by the lockup latch of the third element 630, the data 683 captured by FF1 of the third element 630, and the data 685 captured by FF3 of the third element 630. Accordingly, the output of the second series of the third element 630 can include a bit stream with the following bits: 1, 5, 9, and D.

The third element 630 can include a switching component, such as a multiplexer, that combines the outputs of the first series of memory components of the third element 630 with the outputs of the second series of memory components of the third element 630. The switching component can operate at a higher frequency than the memory components of the third element 630. For example, the switching component of the third element 630 can operate at the first divided clock signal 660 that has a rate of D/2, instead of the second divided clock signal 670 that has a rate of D/4. The output of the switching component is represented as data 686. This output is provided to a second signal-in line (SI1) of the upsampler multiplexer 604.

The upsampler multiplexer 604 is a switching component that upsamples the outputs of the third element 630 and the second element 620 to generate an input vector to provide to the fourth element 640. For example, the multiplexer 604 can switch between sampling the data 676 of the second element 620 and the data 686 of the third element 630. The multiplexer 604 can operate at the undivided clock signal 652 (e.g., the upsampling clock signal 656) that has a clock rate D that is twice the rate at which the data 676 and the data 686 is being provided at. By operating at the undivided clock rate D, the multiplexer can switch between and sample both the data 676 and the data 686 without missing any bits of data. The output of the multiplexer 604 is provided on the input line of the fourth element 640. The output of the multiplexer 604 is represented as the upsample input data 690.

From the data 690 provided by the multiplexer 604 to the input line of the fourth element 640, the first series of memory components in the fourth element 640 can capture the positionally odd bits of data. For example, see the data 692 captured by FF0 of the fourth element 640 and the data 694 captured by FF2 of the fourth element 640. Accordingly, the output of the first series of the fourth element 640 can include a bit stream with the following bits: 1, 3, 5, 7, and 9.

From the data 690 provided by the multiplexer 604 to the input line of the fourth element 640, the second series of memory components in the fourth element 640 can capture the positionally even bits of data. For example, see the data 691 captured by the lockup latch of the fourth element 640, the data 693 captured by FF1 of the fourth element 640, and the data 695 captured by FF3 of the fourth element 640. Accordingly, the output of the second series of the fourth element 640 can include a bit stream with the following bits: 0, 5, 4, 6, and 8.

The fourth element 640 can include a switching component, such as a multiplexer, that combines the outputs of the first series of memory components of the fourth element 640 with the outputs of the second series of memory components of the fourth element 640. The switching component can operate at a higher frequency than the memory components of the fourth element 640. For example, the switching component of the fourth element 640 can operate at the undivided clock signal 652 that has a rate of D, instead of the first divided clock signal 660 that has a rate of D/2. The output of the switching component is represented as data 696. This output can be provided to the mask 218 or to the compressor 136, and be used to, for example, generate a test output.

The scan chain 602 can provide additional benefits. For example, the design of the scan chain 602 can achieve further dynamic power savings through the use of slower shifting between memory components (e.g., at the D/4 shifting rate in half of the memory components of the scan chain) without substantially increasing testing time.

FIG. 7 is a flowchart of an example process 700 for using a high throughput scan architecture. The process can be performed, at least in part, using the testing system 110 described herein with respect to FIG. 1. The process 400 can be performed, at least in part, using the scan chain(s) of the device being tested, such as the scan chain(s) of the device 120a described herein with respect to FIG. 1.

The process 700 includes receiving a set of values that represents a particular data pattern, where the data signal has a first frequency system (702). As an example, with respect to FIG. 1, the set of values can represent the test pattern selected by the test system 110 and provided by the test system 110 on a scan-in line of the scan architecture 130. The set of values can include, for example, multiple bit streams that the decompressor 134 provides as inputs to the multiple scan chains 202 of the scan architecture 130.

For example, the set of values can include a first set of values that are to be loaded into a first scan chain of the scan architecture 130. The set of values can also include a second set of values that are to be loaded into a second scan chain of the scan architecture 130 where the first set of values and the second set of values differ.

As described above, the test pattern and, therefore, the set of values selected by the test system 110 can be based on different factors. For example, with respect to FIG. 1, the set of values received on the scan-in line of the electronic device 122a can be selected by the tests system 110 based on the model of the electronic device 122a. Additionally or alternatively, the test system 110 can select the set of values based on other factors, such as the intended use or quality control parameters for the electronic device 122a, and/or the types of tests to be performed on the electronic device 122a.

In some implementations, the set of values is retrieved by the test system 110. For example, with respect to FIG. 1, the test system 110 can access a particular test pattern from the test patterns 116 of the data storage 112 to use for testing the electronic device 122a.

In some implementations, the set of values are generated by the test system 110. For example, with respect to FIG. 1, the test system 110 can generate a test pattern that includes the set of values for testing the electronic device 122a in response to the electronic device 122a being placed in the position 124 of the device test queue 120.

The process 700 includes generating a first data signal using at least a portion of the values in the set of values (704). The first data signal can have a first frequency, e.g., be driven at a first data rate. For example, the set of values can include a first set of values that are to be loaded into a first scan chain of the scan architecture 130. A decompressor of the electronic device that receives the set of values can generate the first data signal. For example, with respect to FIGS. 1-2, the decompressor 134 can generate the first data signal by driving a subset of bits obtained from the scan-in line into a first scan chain of the scan chains 202. In driving the subset of bits, the decompressor 134 can use a first clock signal from the clock controller 138 that has a first clock rate. The first frequency of the first data signal can be the first clock rate.

As an example, the clock signal that a decompressor receives and uses to generate the first data signal can be an undivided clock rate. This can mean that the clock signal that the decompressor of the electronic device being tested, as well as the compressor of the electronic device, receives is obtained directly from a clock network of the device's clock controller and/or is not be passed through a divider of the clock controller. However, one or more other clock signals provided by the clock controller, such as those provided to the latches of the scan chains in the scan architecture 130 of the electronic device, can be generated using a divider.

In some implementations, the first data signal is generated in response to receiving input the enables a shift mode. For example, with respect to FIGS. 2-3, the decompressor 134 can start driving bits into the scan chains 202 in response to the scan architecture 130 receiving input that enables shift mode to start a shift-in of bits into the scan chains 202.

The process 700 includes using a first series of latches and a second series of latches to extract alternating values of the at least portion of values from the first data signal (706). The first series of latches and the second series of latches can extract the alternating values at a second frequency that is a fraction of the first frequency. For example, the scan chain can be designed so that a first flip-flop of the first series of latches captures the positionally odd bits driven by the decompressor 134 while a second flip-flop in the second series of latches captures the positionally even bits driven by the decompressor 134. This can be achieved through an additional component being placed in one of the series of latches, such as a lockup latch (e.g., the lockup latch 232a shown in FIG. 2) or a specialized latch (e.g., the flip-flop 510 shown in FIG. 5B or the flip-flop 520 shown in FIG. 5C).

The additional component can prevent the first series of latches and the second series of latches from ever capturing the same bit driven by a decompressor by, for example, introducing a time difference between when the first series of latches and the second series of latches can load values driven by the decompressor. For example, where the typical memory components of the scan chains 202 in the scan architecture 130 such as the flip-flop 222a require a half-cycle of time (e.g., at the divided clock signal) before they are able to load a new value driven by the decompressor 134, both the lockup latch 232a and the flip-flop 510 allow the substantially immediate loading of the new value without requiring the half-cycle of time. This half-cycle of time at the divided clock signal corresponds with a full-cycle of time at the undivided clock signal used by the decompressor 134. Accordingly, in a scan chain of the described scan architecture 130, the series of latches containing the additional component is able to load the first new value driven by the decompressor 134 and the other series of latches, having to wait the full-cycle of the undivided clock signal before being capable of loading a value, is able to load a value only after the decompressor 134 has started driving a second new value.

Continuing the example, due to the scan chains operating at the second frequency that is a fraction of the first frequency, the series of latches containing an additional component will not be free to load another value until the decompressor 134 is driving a third new value. Similarly, the series of latches that does not contain the additional component will not be free to load another value until the decompressor 134 is driving a fourth new value.

The process 700 includes combining an output of the first series of latches with an output of the second series of latches to generate a second data signal (708). For example, a switching component such as a multiplexer can be used to sample between the first series of latches and the second series of latches. The switching component can operate at a frequency that is a multiple of the frequency at which the latches are shifting at. As an example, the multiplexer can operate at the first frequency that a decompressor of the scan architecture 130 uses to drive that at least portion of values into a scan chain that contains the first series of latches and the second series of latches. By latches shifting at this lower frequency and the switching component switching and sampling at this higher frequency (e.g., twice the shifting frequency of the latches), the switching component can ensure that all bits released by the first series of latches and the second series of latches are sampled. The switching component can switch back and forth between the first series of latches and the second series of latches so as to interleave the outputs of the first series of latches with those of the second series of latches.

In some implementations, the second data signal is generated in response to receiving input the enables shift mode for a second time. For example, with respect to FIGS. 2-3, after the decompressor 134 loads a set of bits into the memory components of the scan chains 202, the scan architecture 130 can receive input from the testing system

110 that disables shift mode and enables functional mode so that the bits are passed through logical components of the electronic device being tested and, at least a portion, re-loaded into the memory components of the scan chains 202. The scan chains 202 can start shifting the logically operated bits out of the memory components of the scan chains 202 in response to the scan architecture 130 receiving input that enables shift mode to start a shift-in of bits into the scan chains 202.

In addition to the embodiments described above, the following embodiments are also innovative:

Embodiment 1 is an electronic device comprising: a clock controller that provides multiple clock signals including a first clock signal at a first frequency and a second clock signal at a second frequency that is less than the first frequency; a decompressor configured to receive the first clock signal and provide a first data signal having a set of values, wherein the decompressor is configured to output the values of the first data signal at a first data rate based on the first frequency of the first clock signal; a scan chain comprising a two distinct sets of latches provided as a first series of latches and a second series of latches, wherein the first series of latches and the second series of latches are both configured to receive the first data signal but capture different subsets of values from the first data signal, wherein first series of latches and the second series of latches both receive the second clock signal and capture values from the first data signal at a second data rate based on the second frequency of the second clock signal, and wherein the scan chain is configured to generate a second data signal by combining an output of the first series of latches with an output of the second series of latches; and a compressor configured to receive the first clock signal and obtain the second data signal from the scan chain, wherein the compressor is configured to obtain the second data signal from the scan chain at the first data rate in accordance with the first frequency using the first clock signal.

Embodiment 2 is the electronic device of embodiment 1, wherein extracting the different subsets of values of the set of values from the first data signal comprises alternating, for each value in the set of values, which of the two series of latches captures the value.

Embodiment 3 is the electronic device of any one of embodiments 1-2, wherein extracting the different subsets of values of the set of values from the first data signal comprises: capturing, by the first series of latches, every other value of the first data signal; and capturing, by the second series of latches, the other values of the first data signal that were not captured by the second series of latches.

Embodiment 4 is the electronic device of any one of embodiments 1-3, wherein generating the second data signal comprises interleaving the output of the first series of latches with the output of the second series of latches.

Embodiment 5 is the electronic device of any one of embodiments 1-4, comprising a multiplexer configured to receive the output of the first series of latches, the output of the second series of latches, and the first clock signal, wherein generating the second data signal comprises controlling the multiplexer to alternate between sampling the output of the first series of latches and the output of the second series of latches at the first frequency of the first clock signal.

Embodiment 6 is the electronic device of any one of embodiments 1-5, wherein the scan chain includes an element in one of the series of latches that introduces a timing difference between when the first series of latches are able to capture values from the first data signal and when the second series of latches are able to capture values from the first data signal.

Embodiment 7 is the electronic device of embodiments 6, wherein the timing difference is equivalent to one cycle of the first clock signal.

Embodiment 8 is the electronic device of any one of embodiments 6-7, wherein the element is a lockup latch and the other latches of the first series of latches and the second series of latches are flip-flops.

Embodiment 9 is the electronic device of any one of embodiments 6-8, wherein: the element is a first latch in the first series of latches such that any value captured by the first series of latches is loaded into the element or passed through the element before any other latch in the first series of latches, or the element is a first latch in the second series of latches such that any value captured by the second series of latches is loaded into the element or passed through the element before any other latch in the second series of latches.

Embodiment 10 is the electronic device of any one of embodiments 6-9, wherein the element is a flip-flop of a first type and the other latches of the first series of latches and the second series of latches are flip-flops of a second type.

Embodiment 11 is the electronic device of embodiments 10, wherein: the flip-flop of the first type is a master-slave flip-flop with a master bypass; and the flip-flops of the second type are master-slave flip-flops without a master bypass.

Embodiment 12 is the electronic device of any one of embodiments 6-11, wherein: the element introduces a timing offset between the first series of latches and the second series of latches; and the scan chain includes a second element that removes the timing offset between the first series of latches and the second series of latches.

Embodiment 13 is the electronic device of embodiment 12, wherein: the element and the second element are both part of the first series of latches; or the element and the second element are both part of the second series of latches.

Embodiment 14 is the electronic device of any one of embodiments 12-13, wherein: the second element is a last latch in the first series of latches such that any value captured by the first series of latches must pass through each of the other latches in the first series of latches before reaching the second element; or the second element is a last latch in the second series of latches such that any value captured by the second series of latches must pass through each of the other latches in the second series of latches before reaching the second element.

Embodiment 15 is the electronic device of any one of embodiments 1-14, wherein the second frequency is a division of the first frequency such that the second frequency is equal to the first frequency divided by two raised to an integer greater than zero.

Embodiment 16 is the electronic device of embodiments 15, wherein: the integer is one; and the second frequency is one half of the first frequency.

Embodiment 17 is the electronic device of embodiments 15, wherein: the integer is two; and the second frequency is one fourth of the first frequency.

Embodiment 18 is the electronic device of any one of embodiments 1-17, wherein the clock controller includes a frequency divider that receives the first clock signal and outputs the second clock signal based on the first clock signal.

Embodiment 19 is the electronic device of embodiment 18, wherein: the frequency divider is a programmable frequency divider that is configured to output a variable clock signal at a frequency that is dependent on a programmed state of the programmable frequency divider; and the second clock signal is a variable clock signal having the second frequency that is based on the programmed state of the programmable frequency divider.

Embodiment 20 is the electronic device of any one of embodiments 1-19, wherein the decompressor provides the first data signal in response to the electronic device receiving one or more inputs that enable a shift mode of the electronic device.

Embodiment 21 is the electronic device of embodiment 20, wherein: the electronic device receives one or more second inputs that disable the shift mode of the electronic device; and the scan chain is configured to generate the second data signal in response to the electronic device receiving one or more third inputs that re-enable the shift mode of the electronic device.

Embodiment 22 is an electronic device comprising: a clock controller that provides multiple clock signals including a first clock signal at a first frequency, a second clock signal at a second frequency that is less than the first frequency, and a third clock signal at a third frequency that is less than the first frequency and the second frequency; a decompressor that receives the first clock signal and provides a first data signal having a set of values, wherein the decompressor is configured to output the values of the first data signal at a first data rate based on the first frequency of the first clock signal; a scan chain comprising four distinct groups of latches provided as a first group of latches, a second group of latches, a third group of latches, and a fourth group of latches, wherein each of the four distinct groups of latches have a first series of latches and a second series of latches, wherein the first series of latches and the second series of latches of the first group of latches are both configured to: receive the first data signal but capture different subsets of values from the first data signal; and receive the second clock signal and capture values from the first data signal at a second data rate based on the second frequency of the second clock signal; wherein the first series of latches and the second series of latches of the second group of latches are both configured to: receive the output of the second series of latches of the first group of latches; and receive the third clock signal and capture values from the output of the second series of latches of the first group of latches at a third data rate based on the third frequency of the third clock signal; wherein the first series of latches and the second series of latches of the third group of latches are both configured to: receive the output of the first series of latches of the first group of latches; and receive the third clock signal and capture values from the output of the first series of latches of the first group of latches at a third data rate based on the third frequency of the third clock signal; and wherein the first series of latches and the second series of latches of the fourth group of latches are both configured to: receive a second data signal containing outputs of the second group of latches and outputs of the third group of latches; and receive the second clock signal and capture values from the second data signal at a second data rate based on the second frequency of the second clock signal; wherein the scan chain is configured to generate a third data signal by combining an output of the first series of latches of the fourth group of latches with an output of the second series of latches of the fourth group of latches; and a compressor that receives the first clock signal and obtains the third data signal from the scan chain, wherein the compressor is configured to obtain the third data signal from the scan chain at the first data rate in accordance with the first frequency using the first clock signal.

Embodiment 23 is a method for operating an electronic device, the method comprising: receiving a set of values that represents a particular data pattern; generating a first data signal using at least a portion of the values in the set of values, wherein the first data signal has a first frequency; using a first series of latches and a second series of latches to extract alternating values of the at least portion of values from the first data signal, wherein the first series of latches and the second series of latches extract the alternating values at a second frequency that is a fraction of the first frequency; and combining an output of the first series of latches with an output of the second series of latches to generate a second data signal, where the second data signal has the first frequency.

Embodiment 24 is a system providing a testing interface configured to receive test patterns and output test results using the electronic device recited in any of embodiments 1-22.

Embodiment 25 is a testing system configured to evaluate performance and functionality of the electronic device recited in any of embodiments 1-22.

The examples above primarily described the ambient computing system as being implemented as a system-on-a-chip having integrated processing components. However, the same techniques can also be used to implement an ambient computing system using other arrangements of the underlying computing components. For example, one or more processing components of the ambient computing system, including the ambient ML engine, can be implemented as a co-processor or in a stand-alone chip.

Embodiments of the subject matter and the actions and operations described in this specification can be implemented in digital electronic circuitry, in tangibly-embodied computer software or firmware, in computer hardware, including the structures disclosed in this specification and their structural equivalents, or in combinations of one or more of them. Embodiments of the subject matter described in this specification can be implemented as one or more computer programs, i.e., one or more modules of computer program instructions encoded on a tangible non-transitory storage medium for execution by, or to control the operation of, data processing apparatus. Alternatively or in addition, the program instructions can be encoded on an artificially-generated propagated signal, e.g., a machine-generated electrical, optical, or electromagnetic signal that is generated to encode information for transmission to suitable receiver apparatus for execution by a data processing apparatus. The computer storage medium can be or be part of a machine-readable storage device, a machine-readable storage substrate, a random or serial access memory device, or a combination of one or more of them. A computer storage medium is not a propagated signal.

A computer program, which may also be referred to or described as a program, software, a software application, an app, a module, a software module, an engine, a script, or code, can be written in any form of programming language, including compiled or interpreted languages, or declarative or procedural languages; and it can be deployed in any form, including as a stand-alone program or as a module, component, engine, subroutine, or other unit suitable for executing in a computing environment, which environment may include one or more computers interconnected by a data communication network in one or more locations.

A computer program may, but need not, correspond to a file in a file system. A computer program can be stored in a portion of a file that holds other programs or data, e.g., one or more scripts stored in a markup language document, in a single file dedicated to the program in question, or in multiple coordinated files, e.g., files that store one or more modules, sub-programs, or portions of code.

To provide for interaction with a user, embodiments of the subject matter described in this specification can be implemented on, or configured to communicate with, a computer having a display device, e.g., a LCD (liquid crystal display) monitor, for displaying information to the user, and an input device by which the user can provide input to the computer, e.g., a keyboard and a pointing device, e.g., a mouse, a trackball or touchpad. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's device in response to requests received from the web browser, or by interacting with an app running on a user device, e.g., a smartphone or electronic tablet. Also, a computer can interact with a user by sending text messages or other forms of message to a personal device, e.g., a smartphone that is running a messaging application, and receiving responsive messages from the user in return.

Embodiments of the subject matter described in this specification can be implemented in a computing system that includes a back-end component, e.g., as a data server, or that includes a middleware component, e.g., an application server, or that includes a front-end component, e.g., a client device having a graphical user interface, a web browser, or an app through which a user can interact with an implementation of the subject matter described in this specification, or any combination of one or more such back-end, middleware, or front-end components. The components of the system can be interconnected by any form or medium of digital data communication, e.g., a communication network. Examples of communication networks include a local area network (LAN) and a wide area network (WAN), e.g., the Internet.

The computing system can include clients and servers. A client and server are generally remote from each other and typically interact through a communication network. The relationship of client and server arises by virtue of computer programs running on the respective computers and having a client-server relationship to each other. In some embodiments, a server transmits data, e.g., an HTML page, to a user device, e.g., for purposes of displaying data to and receiving user input from a user interacting with the device, which acts as a client. Data generated at the user device, e.g., a result of the user interaction, can be received at the server from the device.

While this specification contains many specific implementation details, these should not be construed as limitations on the scope of any invention or on the scope of what is being or may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially be claimed as such, one or more features from a claimed combination can in some cases be excised from the combination, and the claim may be directed to a subcombination or variation of a subcombination.

Similarly, while operations are depicted in the drawings and recited in the claims in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. An electronic device comprising:
a clock controller that provides multiple clock signals including a first clock signal at a first frequency and a second clock signal at a second frequency that is less than the first frequency;
a decompressor configured to receive the first clock signal and provide a first data signal having a set of values, wherein the decompressor is configured to output the values of the first data signal at a first data rate based on the first frequency of the first clock signal;
a scan chain comprising a two distinct sets of latches provided as a first series of latches and a second series of latches,
wherein the first series of latches and the second series of latches are both configured to receive the first data signal but capture different subsets of values from the first data signal,
wherein first series of latches and the second series of latches both receive the second clock signal and capture values from the first data signal at a second data rate based on the second frequency of the second clock signal, and
wherein the scan chain is configured to provide a second data signal that combines output of the first series of latches with output of the second series of latches; and
a compressor configured to receive the first clock signal and obtain the second data signal from the scan chain, wherein the compressor is configured to obtain the second data signal from the scan chain at the first data rate in accordance with the first frequency using the first clock signal.

2. The electronic device of claim 1, wherein extracting the different subsets of values of the set of values from the first data signal comprises alternating, for each value in the set of values, which of the two series of latches captures the value.

3. The electronic device of claim 1, wherein extracting the different subsets of values of the set of values from the first data signal comprises:
capturing, by the first series of latches, every other value of the first data signal; and
capturing, by the second series of latches, the other values of the first data signal that were not captured by the second series of latches.

4. The electronic device of claim 1, wherein the scan chain is configured to generate the second data signal by interleaving the output of the first series of latches with the output of the second series of latches.

5. The electronic device of claim 1, comprising a multiplexer configured to receive the output of the first series of latches, the output of the second series of latches, and the first clock signal,
wherein the electronic device is configured to control the multiplexer to alternate between sampling the output of the first series of latches and the output of the second series of latches at the first frequency of the first clock signal.

6. The electronic device of claim 1, wherein the scan chain includes an element in one of the series of latches that introduces a timing difference between when the first series of latches are able to capture values from the first data signal and when the second series of latches are able to capture values from the first data signal.

7. The electronic device of claim 6, wherein the timing difference is equivalent to one cycle of the first clock signal.

8. The electronic device of claim 6, wherein the element is a lockup latch and the other latches of the first series of latches and the second series of latches are flip-flops.

9. The electronic device of claim 6, wherein:
the element is a first latch in the first series of latches such that any value captured by the first series of latches is loaded into the element or passed through the element before any other latch in the first series of latches, or
the element is a first latch in the second series of latches such that any value captured by the second series of latches is loaded into the element or passed through the element before any other latch in the second series of latches.

10. The electronic device of claim 6, wherein the element is a flip-flop of a first type and the other latches of the first series of latches and the second series of latches are flip-flops of a second type.

11. The electronic device of claim 10, wherein:
the flip-flop of the first type is a master-slave flip-flop with a master bypass; and
the flip-flops of the second type are master-slave flip-flops without a master bypass.

12. The electronic device of claim 6, wherein:
the element introduces a timing offset between the first series of latches and the second series of latches; and
the scan chain includes a second element that removes the timing offset between the first series of latches and the second series of latches.

13. The electronic device of claim 12, wherein:
the element and the second element are both part of the first series of latches; or
the element and the second element are both part of the second series of latches.

14. The electronic device of claim 12, wherein:
the second element is a last latch in the first series of latches such that any value captured by the first series of latches must pass through each of the other latches in the first series of latches before reaching the second element; or the second element is a last latch in the second series of latches such that any value captured by the second series of latches must pass through each of the other latches in the second series of latches before reaching the second element.

15. The electronic device of claim 1, wherein the second frequency is a division of the first frequency such that the second frequency is equal to the first frequency divided by two raised to an integer greater than zero.

16. The electronic device of claim 15, wherein:
the integer is one; and
the second frequency is one half of the first frequency.

17. The electronic device of claim 15, wherein:
the integer is two; and
the second frequency is one fourth of the first frequency.

18. The electronic device of claim 1, wherein the clock controller includes a frequency divider that receives the first clock signal and outputs the second clock signal based on the first clock signal.

19. The electronic device of claim 18, wherein:
the frequency divider is a programmable frequency divider that is configured to output a variable clock signal at a frequency that is dependent on a programmed state of the programmable frequency divider; and the second clock signal is a variable clock signal having the second frequency that is based on the programmed state of the programmable frequency divider.

20. A method comprising:

receiving, by an electronic device, a set of values that represents a particular data pattern;

generating, by the electronic device, a first data signal using at least a portion of the values in the set of values, wherein the first data signal has a first frequency;

using, by the electronic device, a first series of latches and a second series of latches to extract alternating values of the at least a portion of values from the first data signal, wherein the first series of latches and the second series of latches extract the alternating values at a second frequency that is a fraction of the first frequency; and combining, by the electronic device, an output of the first series of latches with an output of the second series of latches to generate a second data signal, where the second data signal is provided at the first frequency.

* * * * *